(12) United States Patent
Hattori et al.

(10) Patent No.: US 8,199,269 B2
(45) Date of Patent: Jun. 12, 2012

(54) METHOD FOR MANUFACTURING THIN FILM TRANSISTORS

(75) Inventors: Takashi Hattori, Musashimurayama (JP); Mutsuko Hatano, Kokubunji (JP)

(73) Assignees: Hitachi Displays, Ltd., Chiba-Ken (JP); Panasonic Liquid Crystal Display Co., Ltd., Hyogo-Ken (JP)

( * ) Notice: Subject to any disclaimer, the term of this patent is extended or adjusted under 35 U.S.C. 154(b) by 658 days.

(21) Appl. No.: 12/216,445

(22) Filed: Jul. 3, 2008

(65) Prior Publication Data

US 2009/0015760 A1    Jan. 15, 2009

(30) Foreign Application Priority Data

Jul. 11, 2007    (JP) ................. 2007-181829

(51) Int. Cl.
*G02F 1/136* (2006.01)
*G02F 1/1333* (2006.01)
*H01L 21/00* (2006.01)
*H01L 21/469* (2006.01)

(52) U.S. Cl. .............. 349/43; 349/93; 349/122; 438/26; 438/30; 438/780

(58) Field of Classification Search .............. 349/43, 349/93, 122; 438/26, 30, 780
See application file for complete search history.

(56) References Cited

U.S. PATENT DOCUMENTS

| | | | | |
|---|---|---|---|---|
| 4,393,092 A | * | 7/1983 | Gill | 427/524 |
| 4,596,740 A | * | 6/1986 | Tsukane | 428/336 |
| 5,498,761 A | * | 3/1996 | Wessling et al. | 427/542 |
| 5,891,986 A | * | 4/1999 | Yamaguchi et al. | 528/310 |
| 7,248,315 B2 | | 7/2007 | Arai et al. | |
| 2002/0037605 A1 | | 3/2002 | Ninomiya et al. | |
| 2005/0207020 A1 | * | 9/2005 | Kawamura | 359/634 |
| 2006/0240275 A1 | * | 10/2006 | Gadkaree | 428/641 |
| 2006/0255336 A1 | * | 11/2006 | Kim | 257/40 |
| 2006/0257785 A1 | * | 11/2006 | Johnson | 430/270.1 |
| 2006/0275939 A1 | * | 12/2006 | Yokoyama et al. | 438/48 |
| 2007/0091062 A1 | | 4/2007 | French et al. | |

(Continued)

FOREIGN PATENT DOCUMENTS

JP    03-192321    12/1989

(Continued)

OTHER PUBLICATIONS

Ian French et al., "Thin Plastic Electrophoretic Displays Fabricated by a Novel Process", 2005, SID 05 Digest, pp. 1634-1637.

(Continued)

*Primary Examiner* — Mark Robinson
*Assistant Examiner* — Jerry Blevins
(74) *Attorney, Agent, or Firm* — Stites & Harbison, PLLC; Juan Carlos A. Marquez, Esq

(57) ABSTRACT

A method for manufacturing a thin film transistor including a step of forming a polymer film (a) to a layer above a support substrate, a step of forming a semiconductor element above the polymer film (a), and a step of separating the support substrate from the polymer film (a) formed with the semiconductor element in which the polymer film (a) has a thickness of 1 μm or more and 30 μm or less, a transmittance of 80% or higher to a visible light at a wavelength of 400 nm or more and 800 nm or less, a 3 wt % loss temperature of 300° C. or higher, and a melting point of 280° C. or higher.

12 Claims, 10 Drawing Sheets

U.S. PATENT DOCUMENTS

| | | | | |
|---|---|---|---|---|
| 2007/0134362 A1* | 6/2007 | Heidari | .................. | 425/385 |
| 2009/0104769 A1* | 4/2009 | Lee et al. | .................. | 438/653 |

FOREIGN PATENT DOCUMENTS

| | | |
|---|---|---|
| JP | 2000-243943 | 2/1999 |
| JP | 2000-284243 | 3/1999 |
| JP | 2000-284303 | 3/1999 |
| JP | 2001-125082 | 10/1999 |
| JP | 2001-290138 | 4/2000 |
| JP | 2002-031818 | 7/2000 |
| JP | 2002-033464 | 7/2000 |
| JP | 2002-100790 | 9/2000 |
| JP | 2002-258252 | 3/2001 |
| JP | 2006-237542 | 3/2005 |
| TW | I-239422 | 9/2005 |

OTHER PUBLICATIONS

Ian French et al., "Invited Paper: Flexible Displays and Electronics Made in AM-LCD Facilities by the EPLaR™ Process", 2007, SID 07 Digest, pp. 1680-1683.

Yung-Hui Yeh et al., "7-inch Color VGA Flexible TFT LCD on Colorless Polyimide Substrate with 200 °C a-Si:H TFTs", 2007, SID 07 Digest, pp. 1677-1679.

Office Action from the Taiwan, R.O.C. Patent Office in the corresponding Taiwan Patent Application No. 097117858, dated Dec. 21, 2011.

* cited by examiner

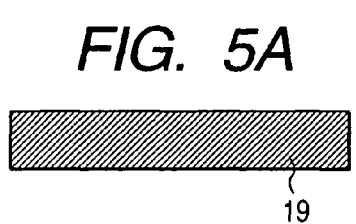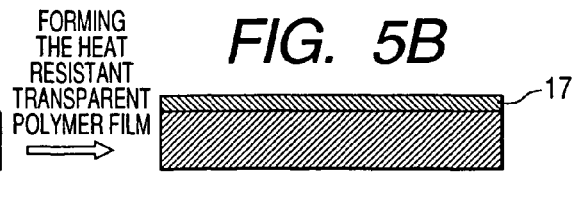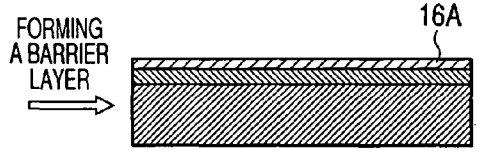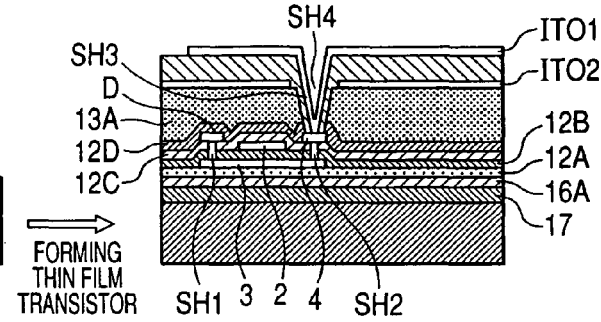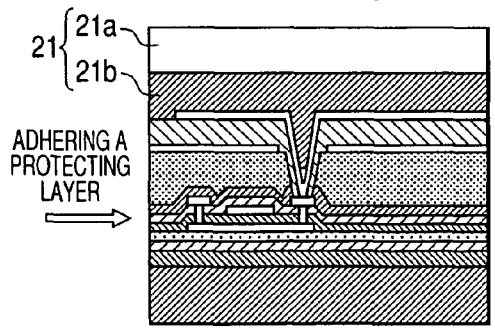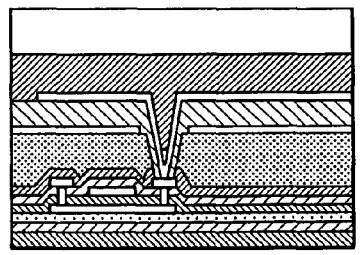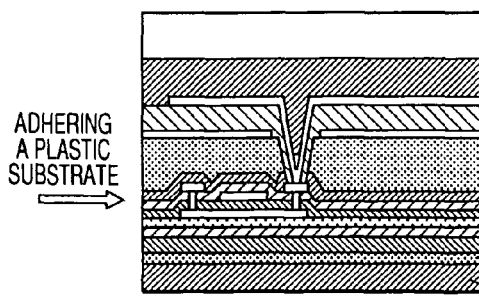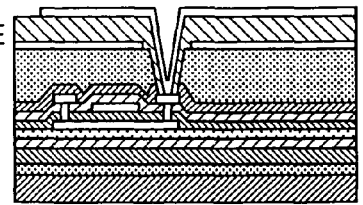

FORMING THE HEAT RESISTANT TRANSPARENT POLYMER FILM →

FORMING A BARRIER LAYER →

FORMING THIN FILM TRANSISTOR →

FORMING A ALIGNMENT LAYER →

ADHERING A COLOR FILTER/ SEALING A LIQUID CRYSTAL MATERIAL →

SEPARATION OF THE GLASS SUBSTRATE →

ADHERING A PLASTIC SUBSTRATE →

LAMINATING A POLARIZATION FILM →

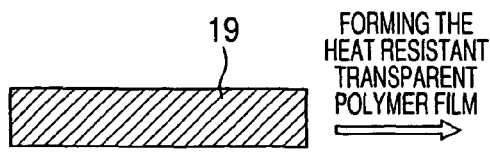
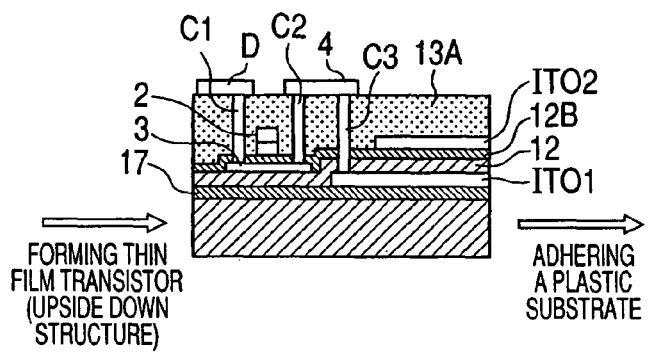
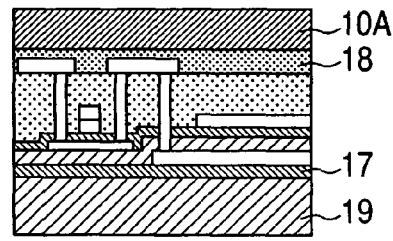
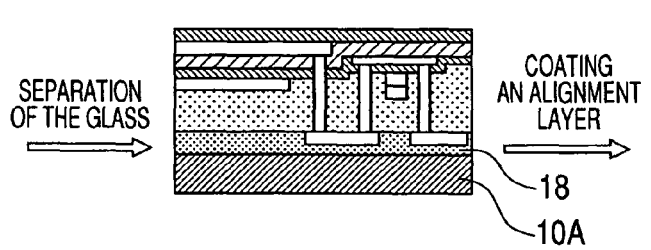
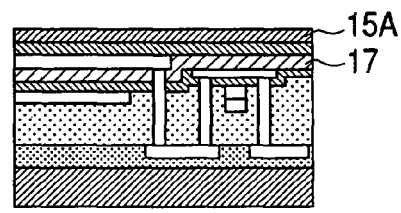
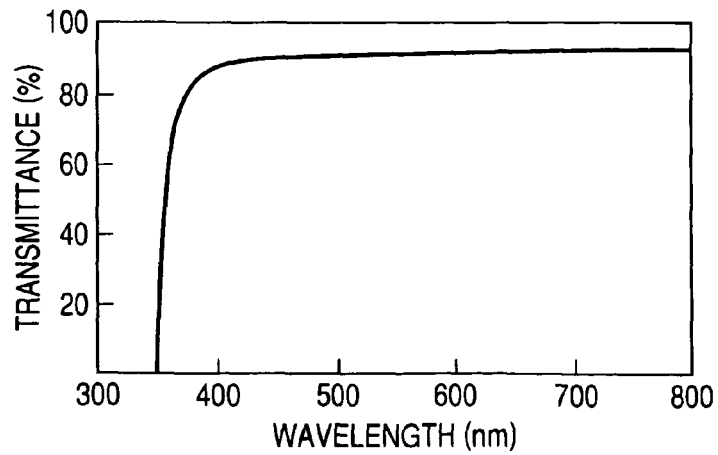

METHOD FOR MANUFACTURING THIN FILM TRANSISTORS

CLAIM OF PRIORITY

The present application claims priority from Japanese patent application JP 2007-181829 filed on Jul. 11, 2007, the content of which is hereby incorporated by reference into this application.

FIELD OF THE INVENTION

The present invention concerns a method for manufacturing semiconductor devices including image display devices typically represented by liquid crystal devices. More specifically, the invention relates to a method of forming active matrix devices represented by thin film transistors (TFTs) on a flexible plastic substrate.

BACKGROUND OF THE INVENTION

For decreasing the weight of a flat panel display typically represented by a liquid crystal display device, it has been studied so far to decrease the thickness of a substrate, and liquid crystal display devices at present are manufactured by using a glass substrate having a thickness of about 0.5 mm to 1.1 mm. However, use of a glass substrate at the thickness less than that described above results in a problem that it tends to be cracked during manufacture or during use. As one of countermeasures, development has been proceeded for a liquid crystal display device of using a plastic substrate instead of the glass substrate.

However, while the heat resistance of the glass substrate is about 600° C., the plastic substrate has the heat resistance usually of about 200° C. and involves a problem that the heat resistance is low. The temperature for forming a thin film transistor is about 300° C. for an amorphous silicon (a-Si) TFT and about 500° C. for a low temperature polysilicon (LTPS) TFT, which is a temperature much higher than the heat resistance of the plastic substrate. Accordingly, as one of countermeasures, a method of lowering the TFT forming temperature has now been under study.

Further since the plastic substrate is soft and flexible different from the glass substrate, it involves a drawback that a line provided for current glass substrates cannot be used as it is. As a countermeasure, it is considered to change the line from a line corresponding to the glass substrate to a roll-to-roll system. As a method of using the current line as it is, a method of transferring TFT formed on a glass substrate to a plastic substrate has been under study. The method of forming and transferring TFT on the glass substrate includes a method of decreasing the thickness by etching the glass substrate or a method of previously forming a separation layer to a glass substrate and conducting separation after formation of TFT. Each of them is a method of reducing the thickness of a glass portion formed with TFT into a thin film and re-locating the same on a plastic substrate. Another transfer method includes a method of bonding a plastic substrate on a glass substrate, forming TFT thereon and then separating the glass substrate.

While the method of once forming TFT on the glass substrate and then decreasing the thickness of the glass has an advantage capable of using the current line and using a current process temperature as it is, when an etching step is adopted for the step of reducing the thickness of the glass substrate, almost of the glass substrate is lost wastefully to result in a drawback of increasing the cost. Further, the method of bonding the plastic substrate on the glass substrate, forming TFT thereon and then conducting separation involves a problem in view of the heat resistance of the plastic substrate and, accordingly, results in a drawback that the process temperature has to be lowered and a device of excellent characteristics cannot be obtained.

The following patent documents are incorporated herein for the purpose of reference:
JP 2737330, JP-A Nos. 2000-243943, 2000-284243, 2000-284303, 2001-125082, 2001-290138, 2002-33464, 2002-31818, 2002-258252, 2006-237542, 2002-100790 (corresponding to US. 2002/0037605A), and 2001-290138

SUMMARY OF THE INVENTION

The present invention intends to provide a method of forming TFT on a plastic substrate by a transfer method, not requiring to lower the process temperature, capable of using a current line and capable of decreasing the cost.

The present inventors, et al. have found that the foregoing problems can be overcome by way of steps of forming a heat resistant and transparent polymer film above a support substrate, forming a semiconductor device above the polymer film and then separating the support substrate, and have accomplished the present invention.

That is, the present application includes the following inventions.

A method of manufacturing a semiconductor device including a step of forming a polymer film (a) above a support substrate, a step of forming a semiconductor element above the polymer film (a), and a step of separating the support substrate from the polymer film (a) formed with the semiconductor element, in which the polymer film (a) has a thickness of 1 µm or more and 30 µm or less, a transmittance for the visible light of 80% or higher, at a wavelength of 400 nm or more and 800 nm or less and a 3 wt % weight loss temperature of 300° C. or higher, and a melting point of 280° C. or higher.
(2) A method of manufacturing a semiconductor device according to (1) described above, wherein the polymer film (a) includes polybenzoxazole.
(3) A method of manufacturing a semiconductor device according to (1) described above, wherein the polymer film (a) includes a polyamidoimide having an alicyclic structure.
(4) A method of manufacturing a semiconductor device according to (1) described above, wherein the polymer film (a) includes a polyimide having an alicyclic structure.
(5) A method of manufacturing a semiconductor device according to (1) described above, wherein the polymer film (a) includes a polyamide.
(6) A method of manufacturing a semiconductor device according to (5) described above, wherein the polyamide has an alicyclic structure.
(7) A method of manufacturing a semiconductor device according to (1) described above, wherein the polymer film (a) includes a poly(p-xylylene).
(8) A method of manufacturing a semiconductor device according to (1) above, further including a step of forming a polymer layer (b) is formed between the support substrate and the polymer film (a).
(9) A method of manufacturing a semiconductor device according to (8) described above, wherein the coefficient of thermal expansion of the polymer layer (b) is smaller than the coefficient of thermal expansion of the polymer film (a).
(10) A method of manufacturing a semiconductor device according to (9) described above, further the polymer layer (b) includes a polyimide.

(11) A method of manufacturing a semiconductor device according to (1) described above, wherein including a step of forming an inorganic layer between the polymer film (a) and the semiconductor device.

(12) A method of manufacturing a semiconductor device according to (11) described above, wherein the inorganic layer includes at least one member selected from silicon oxide, silicon oxynitride, silicon nitride, and aluminum oxide.

(13) A method of manufacturing a semiconductor device according to (1) described above, wherein the step of forming the polymer film (a) above the support substrate includes a cure process in which the cure temperature is 250° C. or higher and at or higher than the process temperature for forming the semiconductor device.

(14) A method of manufacturing a semiconductor device according to (13) described above, wherein the cure process is a cure process under nitrogen or under vacuum.

(15) A method of manufacturing a semiconductor device according to (1) described above, wherein the support substrate is a glass substrate or a quartz substrate.

(16) A method of manufacturing a semiconductor device according to (1) described above, wherein the step of separating the support substrate from the polymer film (a) formed with the semiconductor element includes a UV exposure and the wavelength of the UV rays is 300 nm or more and 400 nm or less.

(17) A method of manufacturing a semiconductor device according to (1) above further including a step of forming a protecting layer on the surface of the semiconductor element before the step of separating the support substrate from the polymer film (a) formed with the semiconductor element.

(18) A method of manufacturing a semiconductor device according to (1) above further including a step of bonding the polymer film (a) formed with the semiconductor element to the plastic substrate (c).

(19) A semiconductor device for display including a first substrate, a second substrate, and liquid crystals put between the first substrate and the second substrate, in which the first substrate has a plastic substrate (c), an adhesive layer disposed on the resin substrate (c) and a plastic film (a) disposed on the adhesive layer, the semiconductor device for display further has an active device formed on the polymer film (a), a first insulating layer formed above the active device, a first electrode disposed in a layer above the first insulating layer, a second insulating layer disposed in a layer above the first electrode, and a second electrode formed above the second insulating layer, in which the first insulating layer has a first contact hole, the second insulating layer is formed between the first electrode and the second electrode and in a first contact hole, a second contact hole is formed to the second insulating layer in the first contact hole, the second electrode is a pixel electrode, the second electrode is electrically connected with the active device by way of the second contact hole, a storage capacity is formed by the first electrode, the second electrode, and the second insulating layer, and the polymer film (a) has a thickness of 1 μm or more and 30 μm or less, a transmittance to a visible light of 80% or higher, at a wavelength of 400 nm or more and 800 nm or less and 3 wt % weight loss temperature of 300° C. or higher.

The present invention provides a method of forming TFT on a plastic substrate by a transfer method, having no requirement for lowering the process temperature, capable of using a current line, and decreasing the cost.

BRIEF DESCRIPTION OF THE ACCOMPANYING DRAWINGS

FIG. 5A is a view showing an example for a method of forming TFT shown in FIG. 4;

FIG. 5B is a view showing an example for a method of forming TFT shown in FIG. 4;

FIG. 5C is a view showing an example for a method of forming TFT shown in FIG. 4;

FIG. 5D is a view showing an example for a method of forming TFT shown in FIG. 4;

FIG. 5E is a view showing an example for a method of forming TFT shown in FIG. 4;

FIG. 5F is a view showing an example for a method of forming TFT shown in FIG. 4;

FIG. 5G is a view showing an example for a method of forming TFT shown in FIG. 4;

FIG. 5H is a view showing an example for a method of forming TFT shown in FIG. 4;

FIG. 16 is a view showing an example for a method of forming TFT shown in FIG. 14; and FIG. 17 is transmission spectra in a UV-ray visible region of a heat resistant transparent polymer film (B-1) of the invention.

DETAILED DESCRIPTION OF THE PREFERRED EMBODIMENTS

Polymer Film (a)

Figure 1:
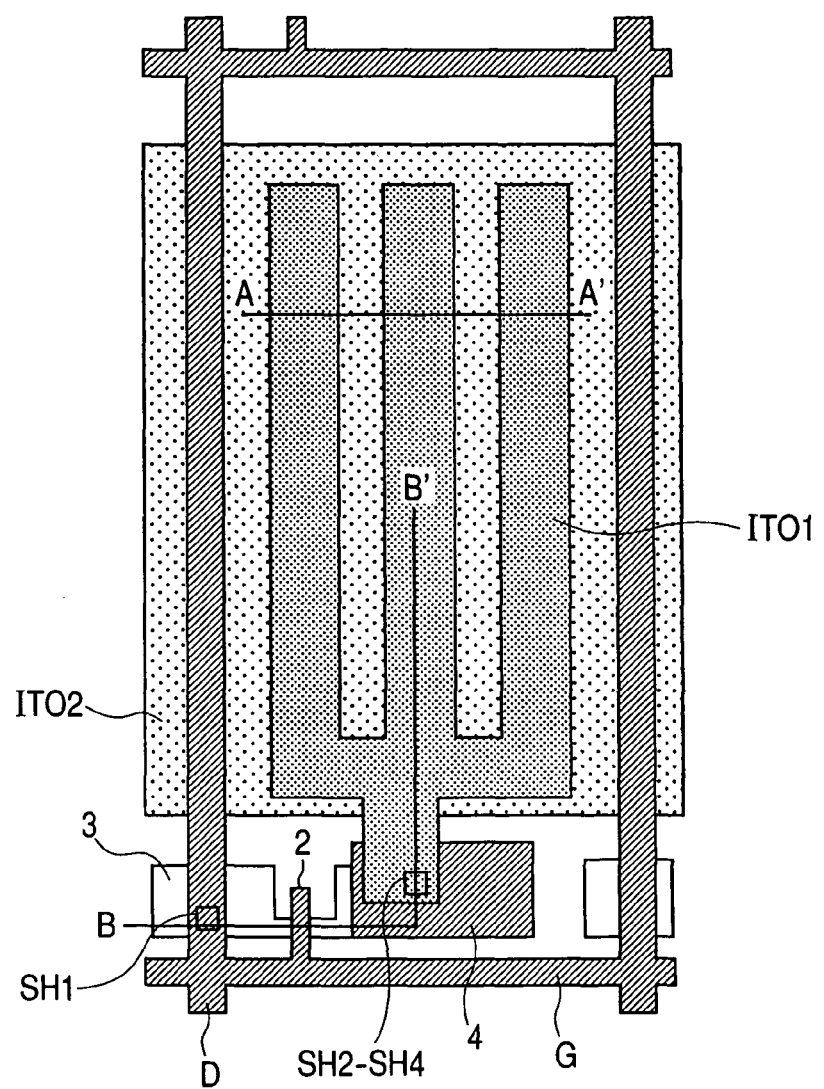
FIG. 1 is a plan view showing the constitution of 1 sub-pixel of a transmissive liquid crystal display panel according to an embodiment of the invention.

The polymer film (a) formed above the support substrate in the invention is a heat resistant and transparent polymer film. More specifically, the polymer film (a) has a thickness of 1 μm or more and 30 μm or less, a transparency to a visible light of 80% or higher at a wavelength of 400 nm or more and 800 nm or less, 3 wt % weight loss temperature of 300° C. or higher, and a melting point of 280° C. or higher.

The thickness of the polymer film (a) is 1 μm or more and 30 μm or less, preferably, 3 μm or more and 25 μm or less and, further preferably, 4.5 μm or more and 15 μm or less. The polymer film (a) having the thickness as described above is excellent in the transparency since lowering of the transmittance by absorption to the polymer can be prevented and also has a mechanical strength as a film.

Further, the polymer film (a) has a transmittance of 80% or higher, preferably, 90% or higher and, more preferably, 95% or higher to light in a visible light region, particularly, at a wavelength of 400 nm or more and 800 nm or less. Since the polymer film having high transmittance to the visible light as described above efficiently allows a light to transmit therethrough when it is finally incorporated in a semiconductor device, an excellent semiconductor device can be obtained.

The polymer film (a) has 3 wt % weight loss temperature of 300° C. or higher, and more preferably, 1 wt % weight loss temperature of 300° C. or higher. In the invention, wt % loss temperature is measured by thermal analysis and means a temperature where weight loss at a specified ratio is observed when the change of weight of a sample is measured continuously while heating the sample at a predetermined rate. Accordingly, the 3 wt % loss temperature means a temperature where the weight of the sample is decreased by 3% compared with that before heating. The weight wt % loss temperature in the invention usually means that measured under nitrogen. More specifically, the 3 wt % loss temperature in the invention means that measured at a measuring temperature from 30° C. to 600° C. at a temperature elevation rate of 10° C./min by TG/DTA-6200 model manufactured by SII Nano Technology Inc. under a nitrogen stream.

In the invention, a semiconductor element is formed above the polymer film (a). While the process temperature for forming a semiconductor element, particularly, an amorphous silicon TFT is about 300° C., since the polymer film (a) having a high wt % loss temperature as described above has heat resistance also to a process temperature of about 300° C., it is not necessary to lower the process temperature and a line used so far can be used as it is.

The polymer film (a) in the invention has a melting point of 280° C. or higher and, preferably, 300° C. or higher and, further preferably, has no substantial melting point. Use of the polymer film (a) having the high melting temperature as described can prevent the polymer film from being melted and causing deformation when it is exposed to a process temperature of about 300° C. in the process for forming the semiconductor element.

The glass transition temperature of the polymer film (a) in the invention is preferably 250° C. or higher and, more preferably, 300° C. or higher. Generally, in a film of a polymer material, the coefficient of thermal expansion thereof abruptly increases when the temperature exceeds a glass transition temperature. Some types of polymer materials cause deformation when the temperature exceeds the glass transition temperature. Accordingly, it is preferred that the temperature of the process for forming the semiconductor element does not exceed the glass transition temperature.

The polymer film (a) described above includes, for example, those containing polymers selected from polybenzoxazole, polyamidoimide having an alicyclic structure, polyimide having and alicyclic structure, polyamide and poly (p-xylylene).

The polybenzoxazole is a polymer material having a benzoxazole unit represented by the following formula in the molecule:

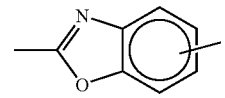

Those having an average degree of polymerization from 5 to 10,000 are used preferably.

As the polybenzoxazole, a polybenzoxazole represented by the formula (1):

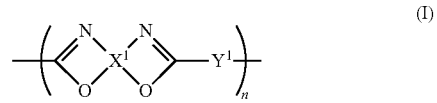

(in which $X^1$ may be identical or different with each other and represents a tetravalent aromatic group, $Y^1$ may be identical or different with each other and represents a bivalent aromatic group or an alicyclic group, n represents an integer of from 5 to 10,000 and, preferably, from 30 to 1,000) is preferred. $X^1$ and $Y^1$ may be identical or different with each other.

In the present specification, the aromatic group may be any group having a benzene ring, or may be a group having a benzene ring in a fused ring. The alicyclic group may be any group having a carbon ring with no aromaticity and may be a group having a fused ring with no aromaticity.

$X^1$ in the formula (I) includes aromatic monocyclic or polycyclic units containing from 5 to 25 carbon atoms and, preferably, from 6 to 20 carbon atoms. $X^1$ in the formula (I) is preferably an aromatic group represented by the following formula:

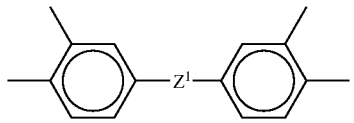

(where $Z^1$ is a direct bond or an organic group, for example, a linear or a branched alkylene group of 1 to 6 carbon atoms, —SO$_2$—, —S—, —O—, —CO—, —NHCO— or —C(CB$_3$)$_2$—, where B is a halogen selected from fluorine, chlorine, bromine or iodine).

$X_1$ in the formula (I) is more preferably selected from the followings:

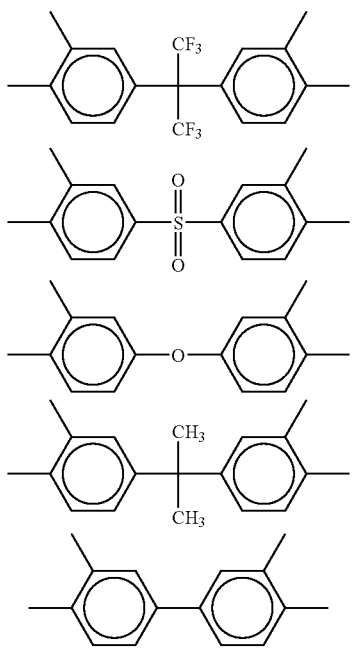

The aromatic group of $Y^1$ in the formula (I) includes aromatic monocyclic or polycyclic units containing from 5 to 25 carbon atoms and, preferably, from 6 to 20 carbon atoms. The alicyclic group of $Y^1$ in the formula (I) includes aromatic monocyclic or polycyclic units containing from 5 to 25 carbon atoms and, preferably, from 6 to 20 carbon atoms.

$Y^1$ in the formula (I) is more preferably selected from the followings:

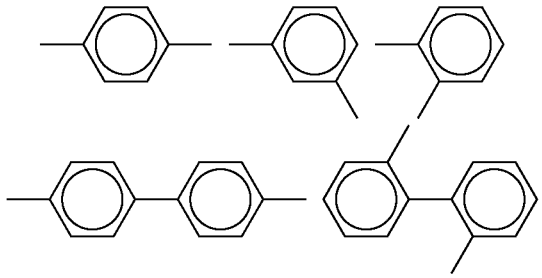

(where $A^1$ is a $C_{1-6}$ alkylene such as —CH$_2$— and —C(CH$_3$)$_2$—, —O—, —S—, SO$_2$—, —CO—, —NHCO— or —C(CF$_3$)$_2$—).

In the $X^1$ and $Y^1$ of the formula (I), the aromatic ring and the alicyclic ring may further has a substituent. The substituent includes, for example, halogen (for example, fluorine, chlorine, bromine, and iodine), hydroxyl, nitro, amino, mercapto, cyano, isocyanate, carboxyl, $C_{1-6}$ alkyl, $C_{2-6}$ alkenyl, $C_{1-6}$ alkoxy. In a case where a plurality of substituents are present, each of the substituents may be identical or different. The number of the substuents is preferably from 1 to 3.

The polybenzoxazole of the formula (I) may be a homopolymer in which units $X^1$ and $Y^1$ contain each one identical group or a copolymer in which the units contain two or more different groups. Those in which $Y^1$ is an alicyclic group are excellent in the transparency in a short wavelength region.

The polybenzoxazoles described above can be obtained by dehydrating cyclization under heating of the following corresponding precursor:

(II)

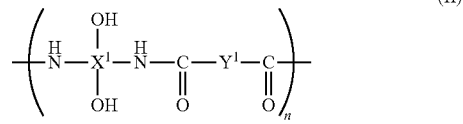

(where $X^1$ and $Y^2$ and n are identical with those defined for the formula (I)).

Also the precursor of the formula (II) may be a homopolymer in which units $X^1$ and $Y^1$ contain each one identical group or a copolymer in which the units contain two or more different groups. The polybenzoxazole derivative can be used together with a cross-linker for improving the heat resistance, mechanical property, and chemical resistance.

The polyamidoimide having the alicyclic structure means a polymer having an amide bond and an imide bond in the molecule and has an alicyclic structure. Those having an average degree of polymerization of from 5 to 10,000 are used preferably.

The example of the polyamidoimide containing the alicyclic structure includes polyamidoimides represented by the formula (III):

(III)

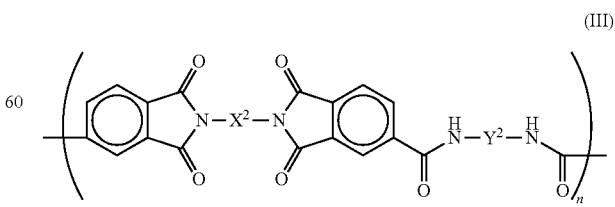

(where $X^2$ may be identical or different with each other and represents a bivalente alicyclic group, $Y^2$ may be identical or different with each other and represents a bivalent aromatic group or an alicyclic group, and n represents an integer of from 5 to 10,000, preferably, from 30 to 1,000). $X^2$ and $Y^2$ may be identical or different with each other.

The alicyclic group of $X^2$ and $Y^2$ in the formula (III) includes a monocyclic or polycyclic alicyclic unit of 5 to 25 carbon atoms and, preferably, 6 to 20 carbon atoms. More preferred are those selected from the followings:

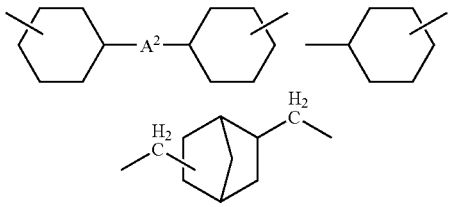

(where $A^2$ is a $C_{1-6}$ alkylene such as —$CH_2$— and —C($CH_3$)$_2$, —O—, —S—, —$SO_2$—, —CO—, —NHCO— or —C($CF_3$)$_2$—).

The aromatic group of $Y^2$ in the formula (III) includes an aromatic monocyclic or polycyclic unit of 5 to 25 carbon atoms and, preferably, 6 to 20 carbon atoms.

The aromatic group of $Y^2$ in the formula (III) includes the aromatic group represented by the following:

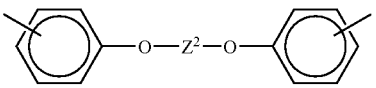

where $Z^2$ is selected from the followings:

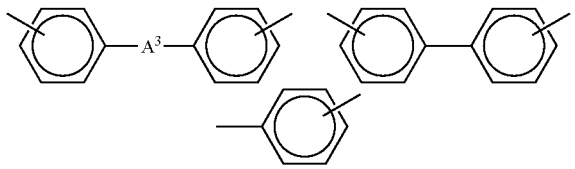

(where $A^3$ is a $C_{1-6}$ alkylene such as —$CH_2$— and —C($CH_3$)$_2$, —O—, —S—, —$SO_2$—, —CO—, —NHCO— or —C($CF_3$)$_2$—). Further, the aromatic group of $Y^2$ in the formula (III) also includes an aromatic group represented by the following:

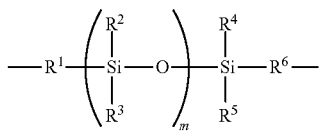

(where $R^1$ and $R^6$ represent, each independently, a direct bond or a bivalent organic group, preferably, an aliphatic group of 1 to 20 carbon atoms, for example, an alkyl group of 1 to 20 carbon atoms, $R^2$ to $R^5$ represent, each independently, an alkyl group of 1 to 20 carbon atoms or an aromatic group of 6 to 18 carbon atoms where one of $R^2$ to $R^5$ is an aromatic group of 6 to 18 carbon atoms, and m represents an integer of 1 to 50).

In the $X^2$ and $Y^2$ of the formula (III), the aromatic ring and the alicyclic ring may further has a substituent. The substituent includes, for example, halogen (for example, fluorine, chlorine, bromine, and iodine), hydroxyl, nitro, amino, mercapto, cyano, isocyanate, carboxy, $C_{1-6}$ alkyl, $C_{2-6}$ alkenyl, $C_{1-6}$ alkoxy. In a case where a plurality of substituents are present, each of the substituents may be identical or different. The number of the substuents is preferably from 1 to 3.

The polyamidoimide of the formula (III) may be a homopolymer in which units $X^2$ and $Y^2$ contain each one identical group or a copolymer in which the units contain two or more different groups.

Another example of the polyamidoimide containing the alicyclic structure includes polyamidoimides represented by the formula (IV):

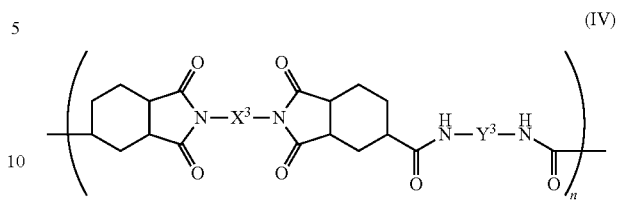

(where $X^3$ may be identical or different with each other and represents a bivalent aromatic group or alicyclic group, $Y^3$ may be identical or different with each other and represents a bivalent aromatic group or an alicyclic group, and n represents an integer of from 5 to 10,000, preferably, 30 to 1,000). $X^3$ and $Y^3$ may be identical or different with each other.

The alicyclic group of $X^3$ and $Y^3$ in the formula (IV) includes groups identical with those described for the alicyclic group of $X^2$ and $Y^2$ in the formula (III) and the aromatic group of $X^3$ and $Y^3$ in the formula (IV) include groups identical with those described for the aromatic group of $X^2$ and $Y^2$ in the formula (III).

In the $X^3$ and $Y^3$ of the formula (IV), the aromatic ring and the alicyclic ring may further has a substituent. The substituent includes, for example, halogen (for example, fluorine, chlorine, bromine, and iodine), hydroxyl, nitro, amino, mercapto, cyano, isocyanate, carboxy, $C_{1-6}$ allkyl, $C_{2-6}$ alkenyl, $C_{1-6}$ alkoxy. In a case where a plurality of substituents are present, each of the substituents may be identical or different. The number of the substuents is preferably from 1 to 3.

The polyamidoimide of the formula (IV) may be a homopolymer in which units $X^3$ and $Y^3$ contain each one identical group or a copolymer in which the units contain two or more different groups.

The polyamidoimide can be synthesized by a known method, for example, an acid chloride method or an isocyanate method. The polyamidoimide can be used together with a cross-linker for improving the heat resistance, mechanical property and chemical resistance.

The polyimide having the alicyclic structure means a polymer having an imido bond in the molecule and has an alicyclic structure. Those having an average degree of polymerization of 5 to 10,000 are used preferably.

The example of the polyimide containing the alicyclic structure includes a polyimide represented by the formula (V):

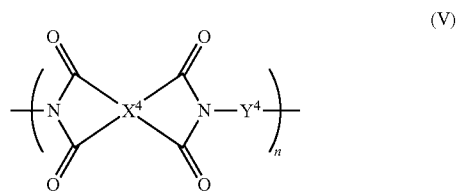

(where $X^4$ may be identical or different with each other and represents a tetravalent alicyclic group, $Y^4$ may be identical or different with each other and represents a bivalent aromatic group or an alicyclic group, and n represents an integer of from 5 to 10,000, preferably, from 30 to 1,000). $X^4$ and $Y^4$ may be identical or different with each other.

The alicyclic group of $X^4$ in the formula (V) includes monocyclic or polycyclic alicyclic units containing 5 to 25 carbon atoms and, preferably, 6 to 20 carbon atoms. More preferred are those selected from the followings:

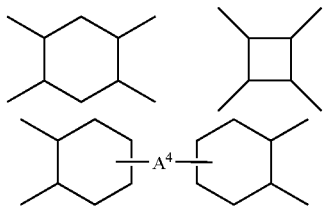

(where $A^4$ is a $C_{1-6}$ alkylene such as —$CH_2$— and —$C(CH_3)_2$—, —O—, —S—, —$SO_2$—, —CO—, —NHCO— or —$C(CF_3)_2$—).

The alicyclic group of $Y^4$ in the formula (V) includes monocyclic or polycyclic alicyclic units containing 5 to 25 carbon atoms and, preferably, 6 to 20 carbon atoms. More preferred are those selected from the followings:

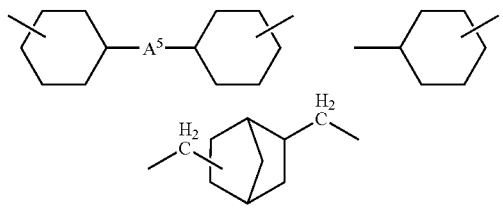

(where $A^5$ is a $C_{1-6}$ alkylene such as —$CH_2$— and —$C(CH_3)_2$—, —O—, —S—, —$SO_2$—, —CO—, —NHCO— or —$C(CF_3)_2$—).

The aromatic group of $Y^4$ in the formula (V) includes aromatic monocyclic or polycyclic units containing 5 to 25 carbon atoms and, preferably, 6 to 20 carbon atoms. The aromatic group of $Y^4$ in the formula (V) includes aromatic groups represented by the followings:

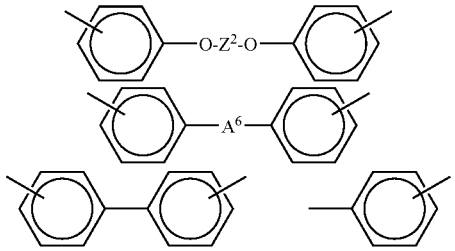

(where $Z^3$ is identical with those described for $Z^2$ in the definition for the formula (III), and $A^6$ is a $C_{1-6}$ alkylene such as —$CH_2$— and —$C(CH_3)_2$—, —O—, —S—, —$SO_2$—, —CO—, —NHCO— or —$C(CF_3)_2$—).

The aromatic group of $Y^4$ in the formula (V) also includes aromatic groups represented by the followings:

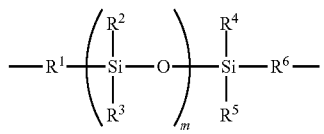

($R^1$ and $R^6$ represent, each independently, a direct bond or a bivalent organic group, preferably, an aliphatic group of 1 to 20 carbon atoms, for example, an alkyl group of 1 to 20 carbon atoms, $R^2$ to $R^5$ represent, each independently, an alkyl group of 1 to 20 carbon atoms or an aromatic group of 6 to 18 carbon atoms where one of $R^2$ to $R^5$ is an aromatic group of 6 to 18 carbon atoms, and m represents an integer of 1 to 50).

For $X^4$ and $Y^4$ in the formula (V), the aromatic ring and the alicyclic ring may further has a substituent, the substituent includes, for example, halogen (for example, fluorine, chlorine, bromine, and iodine), hydroxyl, nitro, amino, mercapto, cyano, isocyanate, carboxyl, $C_{1-6}$ alkyl, $C_{2-6}$ alkenyl, $C_{1-6}$ alkoxy. In a case where a plurality of substituents are present, each of the substituents may be identical or different. The number of the substuents is preferably from 1 to 3.

The polyimide of the formula (V) may be a homopolymer in which units $X^4$ and $Y^4$ contain each one identical group or a copolymer in which the units contain two or more different groups.

It is preferred for the polyimide that a film is formed in a state of a polyamic acid as a precursor which is then thermally cured into a polyimide. Further, the polyamic acid can be used together with a cross-linker for improving the heat resistance, the mechanical property, and the chemical resistance. In a case where it is soluble to a solvent can be coated in a state cyclized as the polyimide, this may also be used. Also in this case, a cross-linker for improving the heat resistance, the mechanical property, and the chemical resistance can be used together.

The polyamide means a polymer having an amide bond in the molecule. Those having an average degree of polymerization of from 5 to 10,000 are used preferably. An example of the polyamide includes a polyamide represented by the formula (VI):

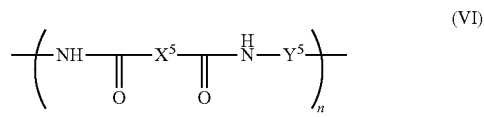

(VI)

(where $X^5$ may be identical or different with each other and represents a bivalent aromatic group or alicyclic group, $Y^5$ may be identical or different with each other and represents a bivalent aromatic group or an alicyclic group, and n represents an integer of from 5 to 10,000, preferably, 30 to 1,000). $X^5$ and $Y^5$ may be identical or different with each other.

The alicyclic group of $X^5$ and $Y^5$ in the formula (VI) includes monocyclic or polycyclic alicyclic units containing 5 to 25 carbon atoms and, preferably, 6 to 20 carbon atoms. More preferred are those selected from the followings:

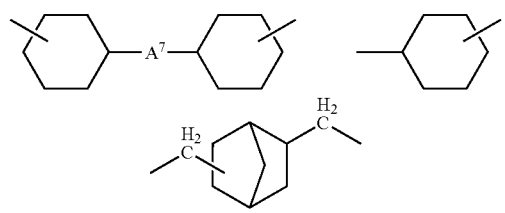

(where $A^7$ is a $C_{1-6}$ alkylene such as —$CH_2$— and —$C(CH_3)_2$—, —O—, —S—, —$SO_2$—, —CO—, —NHCO— or —$C(CF_3)_2$—).

The aromatic group of $X^5$ and $Y^5$ in the formula (V) includes aromatic monocyclic or polycyclic units containing 5 to 25 carbon atoms and, preferably, 6 to 20 carbon atoms.

The aromatic group of $X^5$ and $Y^5$ in the formula (V) includes aromatic groups represented by the followings:

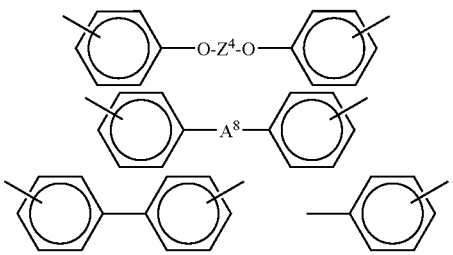

(where $Z^4$ is identical with those described for $Z^2$ in the definition for the formula (III), and $A^8$ is a $C_{1-6}$ alkylene such as —$CH_2$— and —$C(CH_3)_2$—, —O—, —S—, —$SO_2$—, —CO—, —NHCO— or —$C(CF_3)_2$—).

The aromatic group of $X^5$ and $Y^5$ in the formula (VI) also includes aromatic groups represented by the followings:

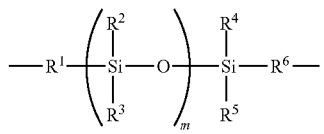

(where $R^1$ and $R^6$ represent, each independently, a direct bond or a bivalent organic group, preferably, an aliphatic group of 1 to 20 carbon atoms, for example, an alkyl group of 1 to 20 carbon atoms, $R^2$ to $R^5$ represent, each independently, an alkyl group of 1 to 20 carbon atoms or an aromatic group of 6 to 18 carbon atoms where one of $R^2$ to $R^5$ is an aromatic group of 6 to 18 carbon atoms, and m represents an integer of 1 to 50).

As the polyamide, those having the alicyclic structure are preferred. Accordingly, one of $X^5$ and $Y^5$ is preferably an alicyclic group.

For $X^5$ and $Y^5$ in the formula (VI), the aromatic ring and the alicyclic ring may further has a substituent. The substituent includes, for example, halogen (for example, fluorine, chlorine, bromine, and iodine), hydroxyl, nitro, amino, mercapto, cyano, isocyanate, carboxy, $C_{1-6}$ allkyl, $C_{2-6}$ alkenyl, $C_{1-6}$ alkoxy. In a case where a plurality of substituents are present, each of the substituents may be identical or different. The number of the substuents is preferably from 1 to 3.

The polyamide of the formula (VI) may be a homopolymer in which units $X^5$ and $Y^5$ contain each one identical group or a copolymer in which the units contain two or more different groups.

Further, the polyimide can be used together with a cross-linker for improving the heat resistance, the mechanical property, and the chemical resistance.

The poly(p-xylylene) means a polymer having a p-xylylene structure in the molecule. Those having an average degree of polymerization of 100 or more and, preferably, 100 to 10,000 are used preferably. The example of the poly(p-xylylene) includes poly(p-xylylene) represented by the formula (VII):

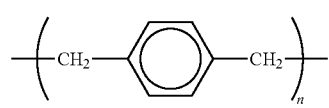

(VII)

(where n represents an interger of from 100 to 10,000).

In the formula (VII), the aromatic ring may further has a substituent. The substituent, includes, for example, halogen (for example, fluorine, chlorine, bromine, and iodine), hydroxyl, nitro, amino, mercapto, cyano, isocyanate, carboxy, $C_{1-6}$ alkyl, $C_{2-6}$ alkenyl, $C_{1-6}$ alkoxy. In a case where a plurality of substituents are present, each of the substituents may be identical or different. The number of the substituents is preferably from 1 to 3.

The poly(p-xylylene) is preferably put to chemical vapor deposition by using a vacuum apparatus.

The polymer film (a) is preferably those containing polymer material selected from the polybenzoxazole, polyamidoimide having the alicyclic structure, polyimide having the alicyclic structure, polyamide, and poly(p-xylylene) as described above, and the film may contain the materials each alone or in combination. Since the polymer film containing the polymer material has a strength to some extent by itself, the film can be separated as a single film after being formed on a support substrate. Accordingly, this polymer film is advantageous since fracture less occurs even when a semiconductor element is formed thereon and then separated in a state of attaching a protecting layer.

Support Substrate

A support substrate forming the polymer film (a) is not particularly restricted and includes, for example, a glass substrate, a quartz substrate, a silicon substrate (for example, Si wafer) and a metal substrate. The transparent glass substrate, quartz substrate, etc. are preferred in that irradiation of light, etc. can be conducted from the back surface as to be described later. Further, in the invention, after forming the semiconductor element, the support substrate is finally separated from the polymer film. Accordingly, the support substrate undergoes no effects and can be regenerated to decrease the cost in the manufacture of the semiconductor device.

Formation of Polymer Film (a)

The polymer film (a) can be formed by spin coating or slit coating a solution of the polymer or the precursor of the polymer described previously onto the support substrate. Usually, after spin coating or slit coating, prebaking is conducted for evaporation of a solvent. Then, cure baking is conducted at 250° C. or higher in an inert gas atmosphere such as a nitrogen or under vacuum. By conducting cure baking in the inert gas atmosphere or under vacuum, coloration of the polymer film (a) by oxidation can be prevented. The temperature for the cure baking is preferably a temperature not decomposing the polymer material contained in the polymer film (a) and a temperature higher than the temperature for the subsequent process for forming the semiconductor element. Specifically, cure baking is conducted preferably at 300° C. or higher and 400° C. or lower.

Polymer Layer (b)

In the method of manufacturing the semiconductor device of the invention, a polymer layer (b) may be formed between the support substrate and the polymer film (a). The polymer layer (b) preferably has a coefficient of thermal expansion of a value between the support substrate and the polymer film (a). In a case of using the glass substrate or the silicon substrate as the support substrate, the coefficient of thermal expansion of them is at a value of several ppm/K. On the contrary, the coefficient of thermal expansion of the polymer film (a) is usually greater by more than one digit, that is, from several tens to 100 ppm/K. Accordingly, since the difference of the coefficient of thermal expansion is large between the support substrate and the polymer film (a), it may be possibility that stress occurs in the inside or the film is cracked upon curing of the polymer film (a). The problem described above can be mitigated by using the polymer layer (b) having the value for the coefficient of thermal expansion between the support substrate and the polymer film (a).

The polymer layer (b) may be a single layer or plural layers. For example, polymer layers having a rank for the coefficient of thermal expansion can be stacked into three or more layers.

The polymer layer (b) is preferably those having heat resistance and, specifically, those having a coefficient of thermal expansion of from 10 to 40 ppm/K, a thickness of 1 µm or more and 30 µm or less, and 1 wt % loss temperature of 300° C. or higher are preferred. For the transmittance of the polymer layer (b), those transparent layer having the transmittance of 80% or higher to a visible light at a wavelength of 400 nm or more and 800 nm or less may be used but those having lower transmittance and colored to yellow to brown may also be used.

In a case of using the polymer layer (b) having high transmittance to the visible light and being transparent, separation may be conducted at the boundary between the support substrate and the polymer layer (b) as to be described later so as to finally leave the polymer layer (b) to a device having a semiconductor element. On the contrary, in a case of using those having low transmittance and colored to yellow to brown, it is preferred to conduct separation at the boundary between the polymer layer (b) and the polymer film (a) so as not to leave the polymer layer (b) on a device having the semiconductor element.

The polymer for the polymer layer (b) includes, polymers identical with those described for the polymer film (a), for example, polyimide, polyamidoimide, polyamide, and polybezoxazole.

Inorganic Layer

In the method of manufacturing the semiconductor device according to the invention, an inorganic layer may be formed between the resin film (a) and the semiconductor element. The inorganic layer preferably contains at least one member selected from silicon oxide (SiO), silicon oxynitride (SiON), silicon nitride (SiN), and aluminum oxide (AlO). The inorganic layer may contain them each alone or in combination. The inorganic layer functions as a barrier layer for preventing impurities, for example, water and oxygen from intruding from the polymer film (a) to a semiconductor element formed on the polymer film (a).

The thickness of the inorganic layer is usually 10 nm or more and 2,000 nm or less and, preferably, 50 nm or more and 500 nm or less. The inorganic layer may be used as a single layer or, optionally, may be used by stacking as two or more layers. The method of forming the inorganic layer includes, for example, sputtering, reactive plasma deposition, chemical vapor deposition, and plasma CVD. Since the inorganic layer is formed on the polymer film (a) as an organic material, a lower forming temperature is preferred since the polymer film (a) undergoes less damages. Specifically, an inorganic polymer film that can be formed at 100° C. or lower is preferred.

Formation of Semiconductor Element

In the invention, the polymer film (a) is formed above the support substrate, and the semiconductor element is formed further thereabove. The semiconductor device formed above the polymer film (a) is not particularly restricted but the invention is particularly suitable in a case of forming TFT as the semiconductor element. Accordingly, the invention is particularly suitable to the manufacture of a semiconductor device for display.

The semiconductor element can be formed in the same manner as in the case of forming on a usual glass substrate in the prior art. Then, after preferably bonding a protecting layer or the like over the formed semiconductor element and protecting the surface, a separation step to be described later is conducted. In one embodiment of the invention, a polymer film (a) formed with a semiconductor element is bonded subsequently, for example, by way of a transparent adhesive to the polymer substrate (c) and the protecting layer is removed to complete transfer of the semiconductor element.

The protecting layer has a role of preventing the formed semiconductor element from destruction by the stress upon removal of the support substrate. As the protecting layer, those that can be adhered provisionally and then separated are preferred. For such a layer, those having a blowing property by heating to about 150° C. are preferred. Specifically, protecting films used upon back grinding of semiconductor such as "RIBA-ALPHA (manufactured by NITTO Denko Co.) or "Elegrip tape" (manufactured by TOYO ADTEC Co.) can be used. Since they have a property of blowing to cause separation by heating to about 150° C., they can be separated easily as required.

In the invention, while the support substrate can be separated, for example, in a state of a thin film transistor (TFT), the process may further be advanced and the separation step may be conducted after sealing liquid crystals to form a cell. In this case, after forming the alignment layer on a semiconductor element formed above the polymer film (a) and conducting alignment treatment such as rubbing, a sealing step for liquid crystals is conducted by using a color filter prepared separately in a plastic substrate. Then, separation can be conducted by using a color filter as a substrate.

As a further method of the invention, in a case of forming the polymer film (a) above the support substrate and forming a semiconductor element thereabove, the semiconductor element may be formed by overturning the structure of the semiconductor element, for example, TFT upside to down as shown in JP-3482856. In this case, since the structure is overturned, the plastic substrate (c) is bonded by way of a transparent adhesive to the semiconductor device formed above the polymer film (a). Then, the support substrate is separated and the plastic substrate (c) is downwarded and used as it is as a semiconductor device, for example, TFT. In this case, since the protecting layer is not necessary, the step can be simplified. Since the polymer film (a) is present at the uppermost portion of TFT when the plastic substrate (c) is downwarded, an alignment treatment such as rubbing may be conducted and it is used as an alignment layer as it is. An alignment film may further be formed to the polymer film.

That is, in a case of bonding the polymer film (a) formed with the semiconductor element to the plastic substrate (c), it may be bonded on the side of the semiconductor element, or bonded on the side of the resin film (a) after separating the support substrate.

Since the plastic substrate (c) requires no particular heat resistance, it may be a transparent substrate at a thickness of about 50 µm or more and 500 µm or less. Those having transmittance of 90% or higher at a wavelength of 400 nm or more and 800 nm or less are preferred. In order not to cause difference in the coefficient of thermal expansion or the stress between the color filter and TFT bonded to the plastic substrate (c), the film used for the color filer is preferably formed of the same material as the plastic substrate (c). Accordingly, a plastic substrate (c) having a heat resistance of about 200° C. conforming the process for forming the color filter is preferred.

The specific example of the plastic substrate (c) includes, for example, polycarbonate and polyethersulfone and HT substrates manufactured by Nippon Steel Chemical Co., Ltd., etc. are preferred. The substrates can be used in a 200° C. process. While APEL™ manufactured by Mitsui Chemicals Inc. ARTON manufactured by JSR Corp., ZEONOR® manufactured by Zeon Corp., etc. which are cycloolefin copolymer have high transparency. However, since heat resistance is low, the preparation temperature for the color filter has to be lowered to 100 to 150° C.

Separation Step

A step of separating the support substrate from the polymer film (a) formed with the semiconductor device of the invention preferably includes UV-irradiation. In a case of using a transparent substrate such as a glass substrate or a quartz substrate, a light at a wavelength with the transmittance to the substrate of 90% or higher is preferably irradiated not from the surface formed with the semiconductor element but from the surface of the support substrate. UV rays at a wavelength of 200 nm or more and 450 nm or less are preferred. Specifically, g-light (436 nm), h-light (405 nm), i-light (365 nm), light of 313 nm, 254 nm which are bright-lines of mercury lamp, Xe—Hg lamp are preferred. Further, laser light such as XeCl excimer light at a wavelength of 308 nm and KrF excimer laser light at a wavelength of 248 nm, third harmonics (wavelength: 355 nm) or fourth harmonic wavelength (wavelength: 266 nm) of YAG laser (wavelength: 1064 nm) can also be used. The wavelength of the light used is more preferably at a wavelength of 300 nm or more and 400 nm or less. While the light at a wavelength within the range described above effectively transmits the glass substrate as the support substrate but often less transmits the polymer film (a). Further, a light at a wavelength where transmittance to the polymer film (a) is 50% or lower is more preferred. A light at a wavelength where the transmittance to the polymer film (a) is 10% or lower is further preferred. A light of lower transmittance to the polymer film (a) is absorbed at the boundary between the support substrate and the polymer film (a) when it is irradiated from the back surface of the support substrate, and acts efficiently when irradiated from the back surface of the support substrate tending to cause separation.

Further, a step of assisting separation by applying a force to the boundary or a step of assisting separation by immersion in water thereby intruding water to the boundary after the irradiation of UV rays may also be applied.

Separation of the support substrate from the polymer film (a) formed with the semiconductor element can also be conducted by immersion into an aqueous hydrofluoric acid solution at a concentration of 1% or higher and 10% or lower in addition to the irradiation of UV-rays.

When the polymer layer (b) is formed between the support substrate and the polymer film (a) and, particularly, in a case where both of the polymer film (a) and the polymer layer (b) are benzoxazole material, polyimide material, polyamide material, and polyamidoimide material, they can be separated by dipping in water.

In the method of the invention, a polymer film of high heat resistance is formed to a support substrate such as a glass substrate, on which a semiconductor element typically represented by TFT is formed. Accordingly, the semiconductor element can be formed by using a current manufacturing apparatus prepared for glass substrate as it is to form a semiconductor element. In addition, glass material as the support substrate can be utilized repetitively by separating the same from the plastic film (a) formed with the semiconductor element such as TFT. As a result, cost for glass can be saved.

In the existent method, for example, of bonding a polymer substrate of low heat resistance on a glass substrate, on which a semiconductor element is formed and separated, it is necessary to lower the process temperature since there is a problem in the heat resistance of the plastic substrate. Therefore, it involves a problem that the reliability, for example, of a gate insulator is insufficient and a device of excellent property cannot be prepared. In a case of using a usual polyimide material, since the transmittance of the polyimide material is low at a wavelength of 400 nm to 500 nm, the material is colored yellow to brown to result in a problem that it cannot be used, particularly, for TFT of transmissive display. Further, also in a case of a colorless transparent polyimide material, when it is used at a thickness of 100 μm or more, the transmittance for a portion at a wavelength of 400 nm is lowered to result in a problem that this is not suitable to TFT of the transmissive type display. The invention has solved the problem of the heat resistance and the problem of the transparency by forming a colorless transparent polymer film to a thickness as thin as 1 μm or more and 30 nm or less. As a result, in the invention, the process can be conducted at a temperature of about 300° C. which is the existent process temperature, and a device of excellent reliability can be formed.

The present invention is to be described specifically for the preferred embodiments with reference to the drawings. Throughout the drawings for explaining the embodiments, identical references are used for those having identical functions and duplicate descriptions therefor are to be omitted.

EXAMPLES

First Example

Manufacture of Heat Resistant Transparent Polymer Film (a)

A solution of polybenzoxazole precursor (VIII) in propylene glycol monomethyl ether acetate (PGMEA)/γ-butylolactone (BLO) (1/9) was spin coated on a quartz support substrate of 0.6 mm thickness. Then, pre-baking was conducted at 120° C. for 3 min to obtain a coating film of 5.5 μm thickness.

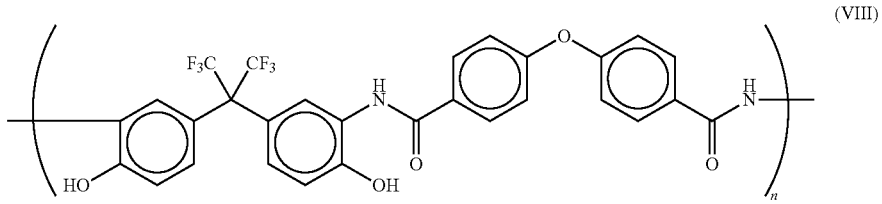

(VIII)

Then, after baking by using an inert gas oven under nitrogen at 200° C. for 30 min, cure baking was conducted at 350° C. for 1 hour to obtain a polybenzoxazole film (B-1) as the polymer film (a) of the invention. The thickness after curing was 4.8 μm. The layer after curing was colorless and transparent.

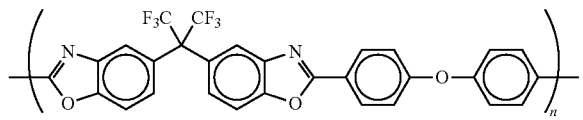

(B-1)

FIG. 17 shows transmission spectra in a region at a wavelength of from 300 nm to 800 nm of a cured layer obtained as described above. It was found that this cured layer showed transmittance of about 90% or higher in a range from 400 nm to 800 nm as a visible region. Further, it was found that transmittance of the cured layer at a wavelength of 350 nm or less is 0% and the film did not transmit the light at the wavelength.

Separately, using a polybenzoxazole film (B-1) prepared by the same procedure on a silicon substrate, thermal desorption spectroscopy was conducted by EMD-WA1000S/W manufactured by ESCO Ltd. As a result, gas desorption was not observed till 350° C. as the curing temperature and the film had high heat resistance. Further, when the film was separated and measured for physical property, it was found that the glass transition temperature was 280° C. and the coefficient of thermal expansion was 50 ppm/K. Further, 3 wt % loss temperature by thermogravimetric analysis was 450° C. In the same manner, the following polymer films (a) from (B-2) to (B-13) were formed. However, for the film (B-12), the film was formed by chemical vapor deposition using dichlorodi (p-xylylene) as the starting material by a vacuum apparatus.

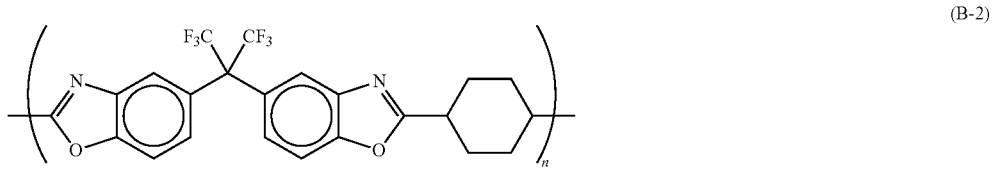
(B-2)

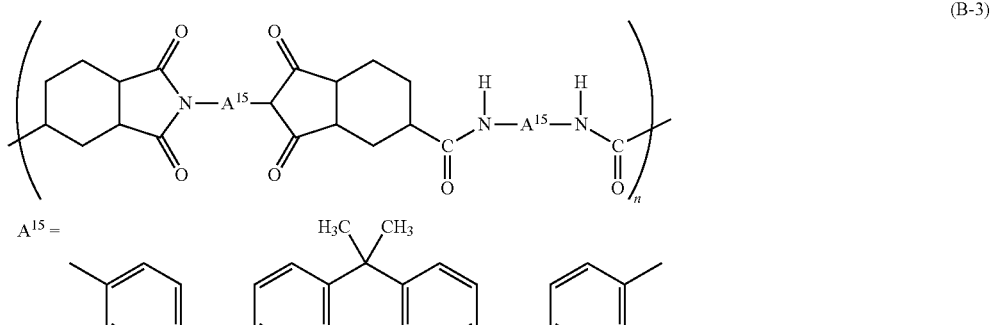
(B-3)

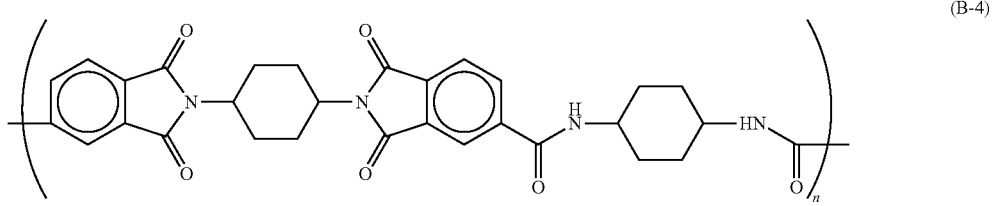
(B-4)

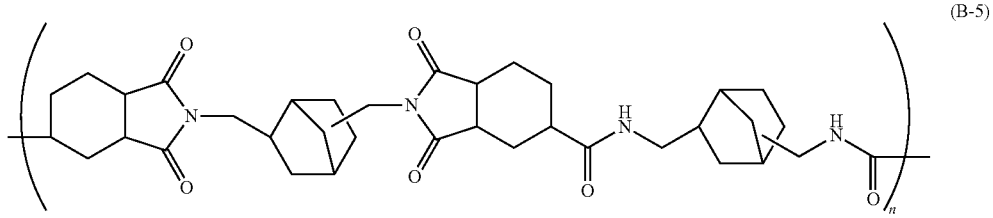
(B-5)

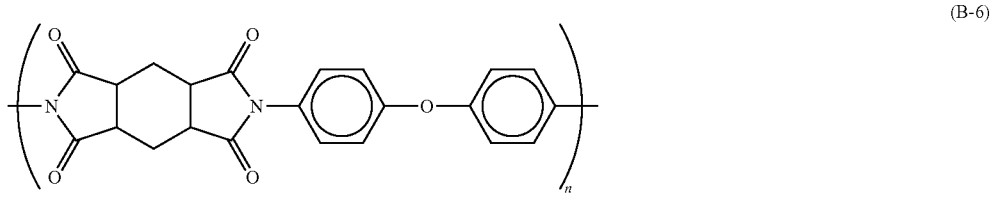
(B-6)

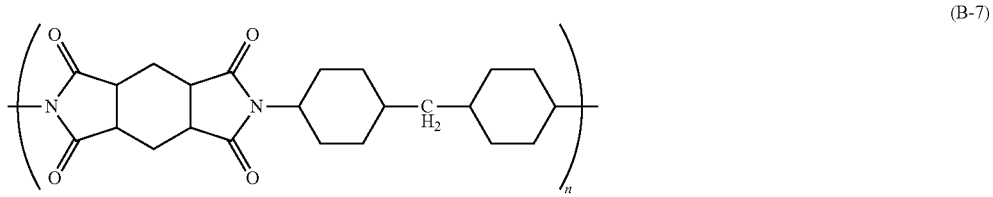
(B-7)

The following Table 1 shows the result of summarizing curing conditions, thickness, transmittance, 3 wt % loss temperature, glass transition temperature (Tg), and a coefficient of thermal expansion (CTE) for each of the polymer films.

TABLE 1

| Material | Curing condition (under nitrogen) | Film thickness (μm) | Transmittance (%) @300 nm | @400 nm | @600 nm | 3 wt % weight loss temperature (° C.) | Tg (° C.) | CTE (ppm/K) |
|---|---|---|---|---|---|---|---|---|
| (B-1) | 350° C. 60 min | 4.8 | 0 | 89 | 93 | 450 | 280 | 50 |
| (B-2) | 310° C. 60 min | 4.4 | 50 | 92 | 93 | 420 | 255 | 62 |
| (B-3) | 320° C. 60 min | 6.7 | 20 | 82 | 92 | 450 | 230 | 68 |
| (B-4) | 300° C. 60 min | 5.2 | 0 | 84 | 92 | 460 | 240 | 60 |
| (B-5) | 320° C. 60 min | 10 | 40 | 90 | 93 | 410 | 220 | 73 |
| (B-6) | 320° C. 60 min | 6.2 | 5 | 88 | 88 | 450 | 320 | 55 |
| (B-7) | 320° C. 60 min | 7.3 | 10 | 88 | 89 | 420 | 260 | 65 |
| (B-8) | 320° C. 60 min | 5.0 | 10 | 90 | 91 | 400 | 320 | 30 |
| (B-9) | 300° C. 60 min | 8.5 | 50 | 91 | 91 | 390 | 330 | 42 |
| (B-10) | 300° C. 60 min | 6.0 | 0 | 87 | 88 | 425 | 280 | 15 |
| (B-11) | 300° C. 60 min | 7.5 | 20 | 84 | 88 | 380 | 230 | 20 |
| (B-12) | Room temp. | 3.5 | 30 | 81 | 82 | 350 | 97 | 30 |

The 3 wt % loss temperature in Table 1 was measured by TG/DTA-6200 model manufactured by SII NanoTechnology Co. under a nitrogen gas stream at a measuring temperature of 30° C. to 600° C. and at a temperature elevation rate of 10° C./min. The glass transition temperature (Tg) and the coefficient of thermal expansion CTE in Table 1 were measured by using TMA-120 model, manufactured by SII NanoTechnology at a measuring temperature of 30° C. to 300° C. and a temperature elevation rate of 5° C./min, under a stretch mode at a load of 10 g. In this case, the temperature at which CTE changed greatly was defined as a glass transition temperature for the sake of convenience.

Although not shown in Table 1, it was found that any of the material did not show melting at least up to 300° C. and the melting point was about 300° C.

Second Example

Manufacture of a Semiconductor Device

Figure 2:
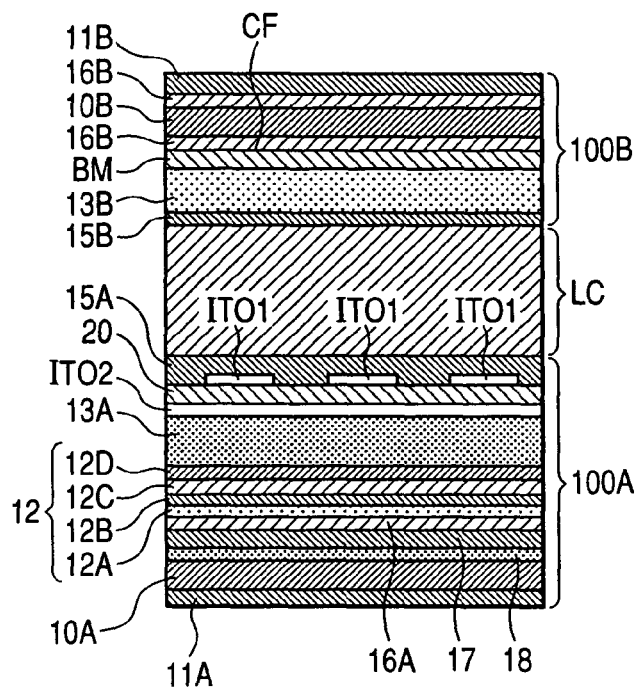
FIG. 2 is a cross sectional view along line A-A' shown in FIG. 1.

FIG. 1 is a plan view showing the constitution of 1 sub-pixel of a transmissive liquid crystal display panel according to an embodiment of the invention. FIG. 2 is a cross sectional view along line A-A' shown in FIG. 1.

The structure of a liquid crystal display panel of this embodiment is to be described with reference to FIG. 2.

The liquid crystal display panel of this embodiment is an in-plane switching type liquid crystal display panel using a planar counter electrode, and the liquid crystal display panel has a transparent substrate (100B) and a transparent substrate (100A) arranged being opposed to each other by way of a liquid crystal layer LC. In this embodiment, the side of the main surface of the transparent substrate (100B) constitutes an observation side.

The transparent substrate 100B has a plastic substrate 10B and barrier layers 16B are formed to the upper and lower surfaces of the plastic substrate. On the side of the liquid crystal layer LC transparent plastic substrate 10B, a barrier layer 16B, a black matrix layer BM, and a color filter layer CF, an overcoat layer 13B, and an alignment layer 15B are formed successively from the transparent plastic substrate 10B to the liquid crystal layer LC. Further, a barrier film 16B and a polarizer 11B are formed to the outer side of the transparent substrate 100B.

Further, a transparent substrate 100A has a plastic substrate 10A and, on the side of the liquid crystal layer LC of the glass substrate 10A, an adhesive layer 18, a heat resistant transparent polymer film 17, a barrier layer 16A, an insulating layer 12, an interlayer insulating layer 13A, a transparent electrode ITO2 that functions as a counter electrode, a transparent insulating film 20, a pixel electrode ITO1, and an alignment film 15A shown in the first embodiment are formed successively from the glass substrate 10A to the liquid crystal layer LC. Further, a polarizer 11A is formed to the outside of the transparent substrate 100A.

Further, the insulating layer 12 comprises an under layer 12A, a gate insulating layer 12B, an interlayer insulating layer 12C, and an interlayer insulating layer 12D. The barrier layer 16A and the under layer 12A may be separate layers or may be constituted with one layer.

Referring again to FIG. 1, there are shown a signal line D (also referred to as a drain line and a source line), a scanning line G (also referred to as a gate line), through holes SH1 to SH4 (also referred to as contact hole), a gate electrode 2, a channel layer (or semiconductor layer) 3, a source electrode 4 (also refereed to as a drain electrode when referring the signal line D as a source line).

Figure 3:
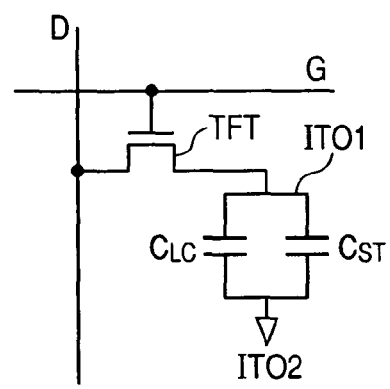
FIG. 3 is a view showing an equivalent circuit of FIG. 1.

FIG. 3 is a view showing an equivalent circuit in FIG. 1. Capacitance element CLC in FIG. 1 is a liquid crystal capacitance, and capacitance element Cst is a storage capacitance (also referred to as accumulation capacitance) formed with a pixel electrode ITO1 formed on both sides of the transparent insulation layer 20 and a transparent electrode (ITO2) that functions as a counter electrode.

In an actual liquid crystal display panel, in a case where the equivalent circuit shown in FIG. 3 is a liquid crystal display panel for color display used, for example, in a mobile phone, sub-pixels are arranged by the number of 240×320×3 in a matrix form. Since the driving method for the liquid crystal display device of this embodiment is identical with that for an in-plane-switching type liquid crystal display device, description for the driving method is to be omitted.

The constitution for the portion of a thin film transistor shown in FIG. 1 is to be described below.

Figure 4:
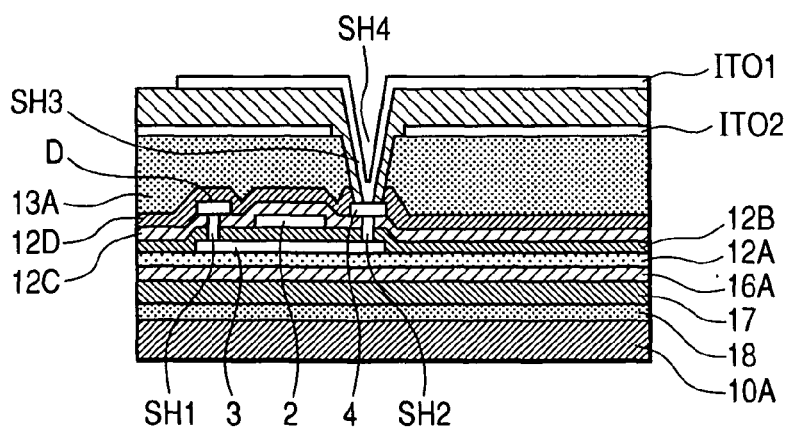
FIG. 4 is a cross sectional view showing a cross sectional structure on the side of a transparent substrate (100A) along line B-B' shown in FIG. 1.

FIG. 4 is a cross sectional view showing a cross sectional structure on the side of the transparent substrate 100A along line B-B' shown in FIG. 1. In FIG. 4, the polarizer 11A is not illustrated. As shown in FIG. 4, a heat resistant polymer film (polymer film (a)) 17 is formed above a glass substrate 10A as a support substrate as shown in the first embodiment, on which a barrier layer (inorganic layer) 16A was formed. Further, an under layer 12A comprising a multilevel film of SiN and SiO$_2$ was formed further thereon and, subsequently, the channel layer 3 (semiconductor layer) was formed. The channel layer 3 comprises an amorphous silicon layer or a poly-silicon layer.

A gate insulating layer 12B comprising, for example, SiO$_2$ is formed on the channel layer 3 and a gate electrode 2 is formed on the gate insulating layer 12B. An interlayer insulating layer 12C comprising, for example, SiO$_2$ or SiN is formed on the gate electrode 2, and a signal line D and a source electrode 4 are formed on the interlayer insulating layer 12C. Then, the channel layer 3 is connected by way of a through hole SH1 to the signal line D and further by way of the through hole SH2 to the source electrode 4.

Further, an interlayer insulating layer 12D comprising, for example, SiO$_2$ or SiN is formed on the signal line D and a source electrode 4 and, an interlayer insulating layer 13A comprising, for example, acrylic resin is formed on the interlayer insulation layer 12D. A through hole SH3 is formed above the source electrode 4 to the interlayer insulating layer 12D and the interlayer insulating layer 13A. A transparent insulating layer 20 is formed in the through SH3. A through hole SH4 is formed further in the transparent insulating layer 20, and the pixel electrode ITO1 is electrically connected with the source electrode 4 by a transparent conducting layer (for example, ITO: Indium-Tin-Oxide) formed in the through hole SH4.

As described above, the pixel electrode ITO1 is connected electrically to the active element formed in the pixel. Then, a video signal is written from the signal line D by way of an active device driven by the scanning line G to the pixel electrode ITO1.

Then, a method of forming a thin film transistor shown in FIG. 4 is to be described with reference to FIG. 5. At first, as shown in FIG. 5B, a coating layer of a thermoresistant transparent polymer of one of (B-1) to (B-12) shown in the first embodiment is formed on a glass substrate 19. A heat resistant transparent polymer film 17 is formed using the curing condition and the thickness shown in Table 1. An SiON film is formed by using a reactive plasma deposition apparatus of ion-plating type at 80° C. to 100 nm thickness thereon as a barrier layer 16A.

Then, as shown in FIG. 5D, an underlayer 12A, a channel layer 3, a gate insulating layer 12B, a gate electrode 2, an interlayer insulating layer 12C, a signal line D, a source electrode 4, an interlayer insulating layer 12D, and an interlayer insulating layer 13A were formed by a usual method, on which a transparent electrode ITO2 is formed. Then, above the source electrode 4, a through hole SH3 is formed to the interlayer insulating layer 12D and the interlayer insulating layer 13A. Then, after forming a transparent insulating layer 20 and after forming a through hole SH4, a pixel electrode ITO1 is formed (FIG. 5D).

Then, a protecting layer 21 is provisionally adhered thereon such that the TFT portion is not destroyed by a stress when glass is separated (FIG. 5E). As the protecting layer, a protecting film used upon back grinding of semiconductor such as "RIBA-ALPHA (manufactured by NITTO Denko Co.) or "Elegrip tape" (manufactured by TOYO ADTEC Co.) can be used.

Then, an Xe—Cl excimer laser light at a wavelength of 380 nm is irradiated from the surface of a glass substrate as a support substrate. Since the heat resistant transparent polymer film used in the invention has transmittance, for example, as shown in FIG. 17, it efficiently absorbs a light at a wavelength of 308 nm and the adhesion at the boundary of glass substrate/heat resistant transparent polymer film is lowered, the glass substrate can be separated (FIG. 5F). In this embodiment, adhesion is lowered by irradiation at a dose of 200 mJ/cm$^2$.

Then, another plastic substrate 10A is adhered as a plastic substrate (c) by a transparent adhesive 18 on the side where the glass substrate has been attached (FIG. 5G). Then, the protecting layer 21 adhered provisionary is separated. "RIBA-ALPHA or "Elegrip" (manufactured by TOYO ADTEC Co.) described previously causes is blown by heating to about 120° C. to 180° C. and can be separated easily. As a result, a TFT transferred to the plastic substrate 10A in a state kept in a normal vertical state is completed (FIG. 5H).

Figure 7:
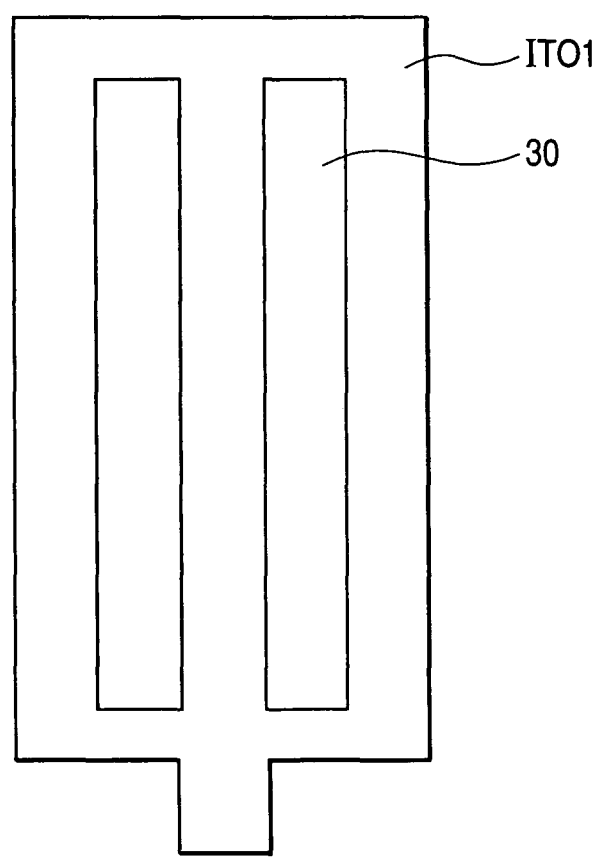
FIG. 7 is a view showing a modified example of a pixel electrode.

In this embodiment, instead of a comb-shape having a slit of a partially opened shape as shown in FIG. 1, the pixel electrode ITO1 may also be in a rectangular shape having a slit 30 of a closed shape in the inside. In any of the cases of FIG. 1 and FIG. 7, the pixel electrode is of a structure having a linear portion.

Figure 8:
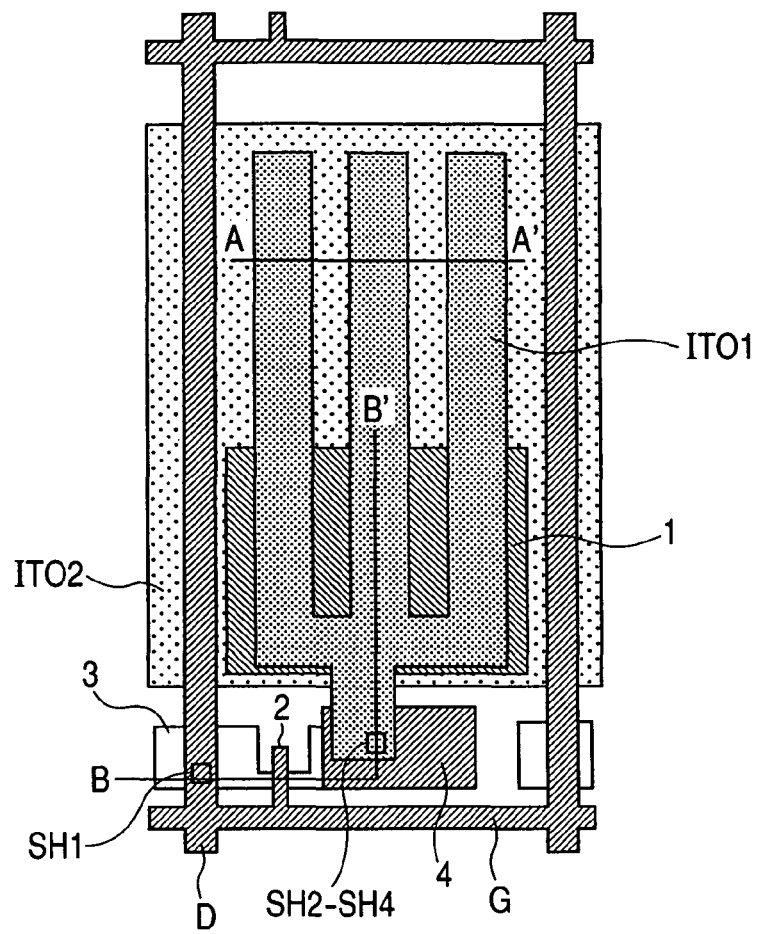
FIG. 8 is a plan view showing the constitution of 1 sub-pixel of a semi-transmissive liquid crystal display panel according to an embodiment of the invention.

FIG. 8 is a plan view showing the constitution of a semi-transmissive in-plane-switching type 1 sub-pixel as a modified example of a liquid crystal display panel according to the invention. In FIG. 8, a reflective electrode 1 is added in addition to the previous structure of FIG. 1. The reflective electrode 1 has a 2-layered structure comprising, for example, a lower molybdenum layer (Mo) (1a) and an upper aluminum layer (Al) (1b). In the semi-transmissive liquid crystal display panel, the region in which the reflective electrode 1 is formed constitutes a reflective liquid crystal display panel and other portion constitutes a transmissive liquid crystal display panel.

Figure 9:
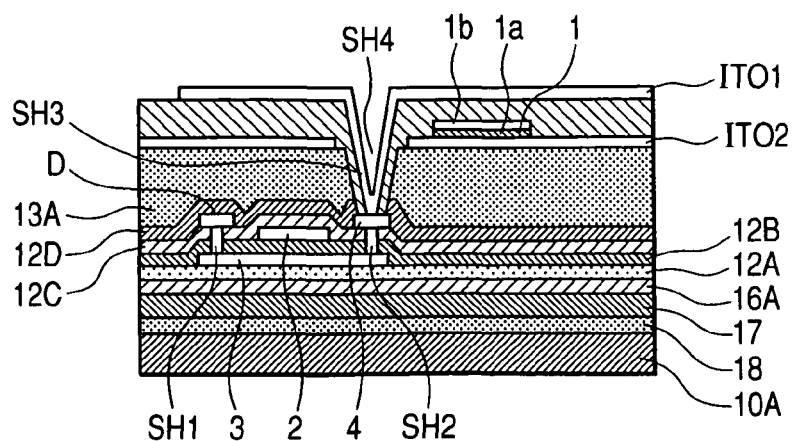
FIG. 9 is a cross sectional view along line A-A' shown in FIG. 8.

FIG. 9 is a cross sectional view showing the cross sectional structure of a portion corresponding to line B-B' shown in FIG. 8. In FIG. 9, the polarizer 11A is not illustrated. In this case, a reflective electrode 1 is formed in addition to the cross sectional view shown previously in FIG. 5. This had a 2-layered structure, for example, comprising a lower molybdenum layer (Mo) (1a) and an upper aluminum layer (Al) (1b).

Figure 10:
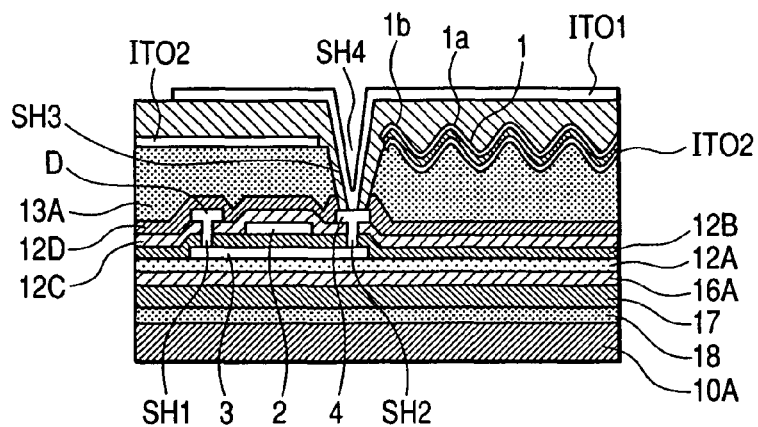
FIG. 10 is a cross sectional view showing a cross sectional structure on the side of a transparent substrate (100A) for a modified example of a liquid crystal display panel according to an embodiment of the invention.

FIG. 10 is a cross sectional view showing a cross sectional structure of a modified example of the invention on the side of a transparent substrate (100A). FIG. 10 is a cross sectional view showing the cross sectional structure for a portion corresponding to line B-B' shown in FIG. 8.

In the structure shown in FIG. 10, an evenness was formed to the reflective electrode 1 for diffusing and reflecting a light incident to the reflective electrode 1. Also in this structure, unevenness on the reflective electrode 1 can be absorbed to planarize the surface of the insulating layer 20.

In the structure shown in FIG. 10, while the counter electrode is not illustrated 100A, it is formed on the side of the transparent substrate in a case of usual in-plane-switching type liquid crystal display panel, or on the side of the transparent substrate 100B in a case of a longitudinal electric field type (for example, twisted nematic or vertical alignment type). Further, in a case of the in-plane-switching type, the reflective electrode 1 may also serve as the outer electrode.

As described above, the invention is not restricted to the in-plane-switching type liquid crystal display panel using a planar counter electrode but is also applicable to a usual in-plane-switching type liquid crystal display panel or a vertical alignment type liquid crystal display panel. In this case, the transparent electrode ITO2 or the reflective electrode 1 is used as an electrode for forming a storage capacitance Cst between it and the pixel electrode ITO1. In a case of the vertical alignment type liquid crystal display panel, the pixel electrode ITO1 may be a shape not having a slit or a slit may be formed for constituting a multidomain.

Figure 11:
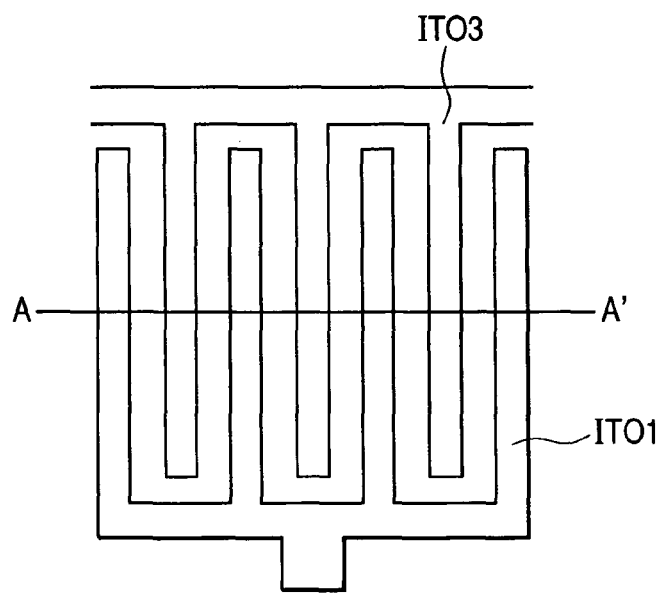
FIG. 11 is a plan view showing the constitution of 1 sub-pixel for a modified example of a transmissive liquid crystal display panel according to an embodiment of the invention.
Figure 12:
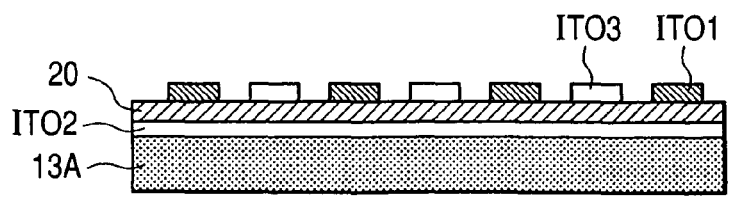
FIG. 12 is a cross sectional view showing a cross sectional structure along line A-A' shown in FIG. 11.

FIG. 11 is a plan view showing the constitution of 1 sub-pixel for a modified example of a liquid crystal display panel of the invention. FIG. 12 is a cross sectional view showing a cross sectional structure along line A-A' shown in FIG. 11. The structure shown in FIG. 11 and FIG. 12 illustrates a structure of applying the invention to a usual in-plane-switching type liquid crystal display panel. In FIG. 11 and FIG. 12, ITO 3 shows a counter electrode. In FIG. 11, the structure other than the interlayer insulating layer 13A on the side of the lower layer (substrate 10A side) of the transparent electrode ITO2 is not illustrated. Also in FIG. 11, the transparent electrode ITO2 has a role of a counter electrode and a role of forming a storage capacitance.

Figure 13:
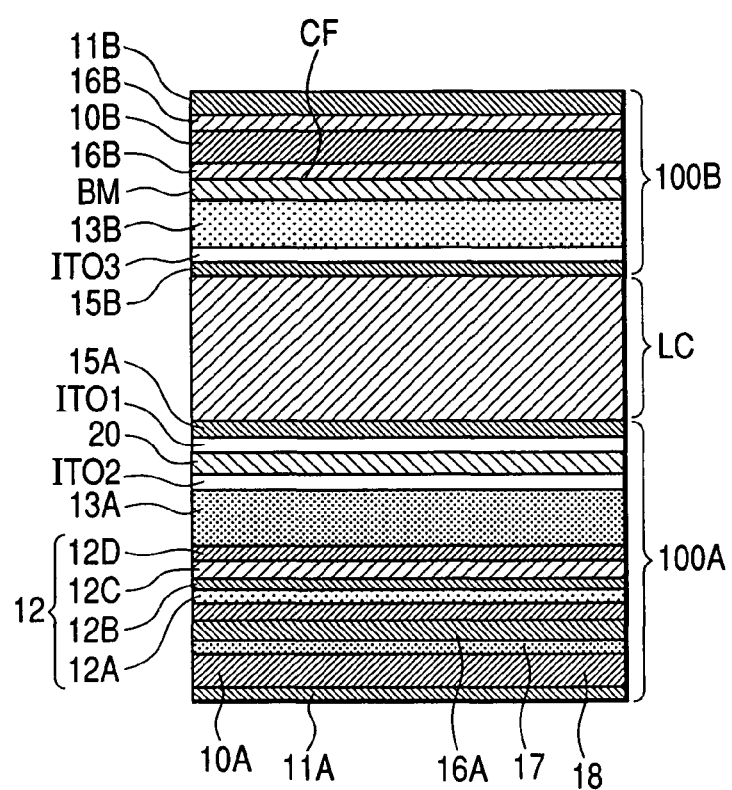
FIG. 13 is a cross sectional view showing a cross sectional structure for a modified example of a liquid crystal display panel according to an embodiment of the invention.

FIG. 13 is a cross sectional view showing a cross sectional structure of a modified example of a liquid crystal display panel according to the invention. FIG. 13 is a cross sectional view showing the cross sectional structure for a portion corresponding to line A-A' shown in FIG. 1. The structure shown in FIG. 13 illustrates a structure of applying the invention to a vertical field effect type liquid crystal display panel. In the vertical field effect type liquid crystal display panel, the counter electrode (also referred to as a common electrode) ITO3 is formed on the side of the transparent substrate 100B. Further, the transparent electrode ITO2 also has a role of forming the storage capacitance. Further, the reflective electrode 1 may also be formed in combination with the embodiment in FIG. 10.

Not only the transmissive type and the semi-transmissive type, but also the reflective type liquid crystal display device can be manufactured in the same manner as in the embodiment described above. In the case of the reflective type, the reflective electrode 1 may be formed instead of the transparent electrode ITO2. Further, in a case of the transmissive type or semi-transmissive type, a back light not illustrated may be disposed to the back surface of the liquid crystal display panel. In a case of the reflective type, a not illustrated front light may be disposed to the front surface (on the side of observer) of the liquid crystal display panel.

Third Example

FIG. 6 shows a modified example for a method of forming a thin film transistor shown in FIG. 5 for the second embodiment. FIG. 6 shows a thin film transistor shown in FIG. 4 or FIG. 2 and a method of forming a liquid crystal device using the same.

In the same manner as the method shown in the second embodiment, a heat resistant transparent resin film 17 of the first embodiment was formed as a polymer film (a) above a glass substrate 19 as a support substrate. A barrier layer (inorganic layer) 16 was formed thereon in the same manner and a TFT portion was formed by a usual method in the same manner FIG. 5D. Then, an alignment layer 15A was formed and a rubbing treatment was applied.

SiON barrier layers of 100 nm thickness were formed on both surfaces of a plastic substrate 10B of 100 μm thickness and, using the same as a substrate, a black matrix BM layer and RGB color filter CF layer were formed by a usual method. The color filter portion 30 had an overcoat layer 13B and an alignment layer 15B.

Figure 6A:
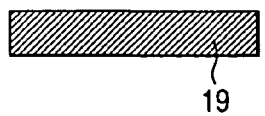
FIG. 6A is a view showing an example for a method of forming TFT and liquid crystal display device showing in FIG. 4 and FIG. 2.
Figure 6B:
FIG. 6B is a view showing an example for a method of forming TFT and liquid crystal display device showing in FIG. 4 and FIG. 2.
Figure 6C:
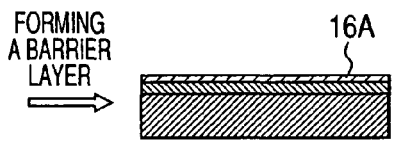
FIG. 6C is a view showing an example for a method of forming TFT and liquid crystal display device showing in FIG. 4 and FIG. 2.
Figure 6D:
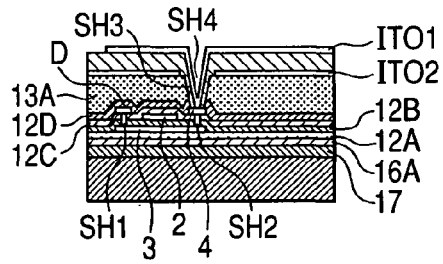
FIG. 6D is a view showing an example for a method of forming TFT and liquid crystal display device showing in FIG. 4 and FIG. 2.
Figure 6E:
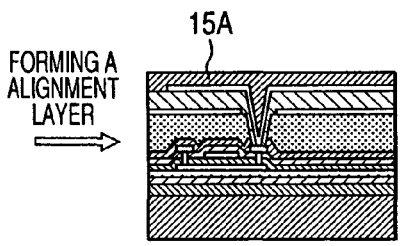
FIG. 6E is a view showing an example for a method of forming TFT and liquid crystal display device showing in FIG. 4 and FIG. 2.
Figure 6F:
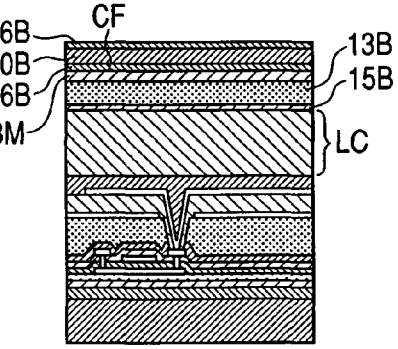
FIG. 6F is a view showing an example for a method of forming TFT and liquid crystal display device showing in FIG. 4 and FIG. 2.
Figure 6G:
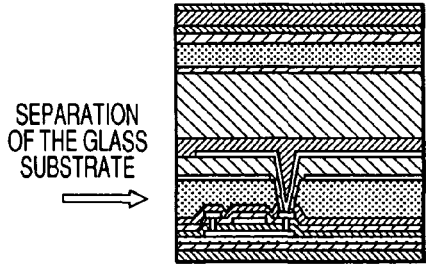
FIG. 6G is a view showing an example for a method of forming TFT and liquid crystal display device showing in FIG. 4 and FIG. 2.
Figure 6H:
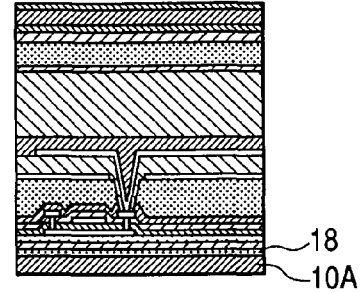
FIG. 6H is a view showing an example for a method of forming TFT and liquid crystal display device showing in FIG. 4 and FIG. 2.
Figure 6I:
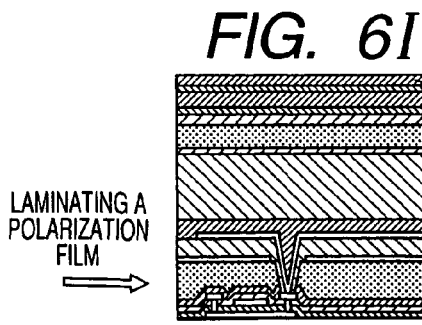
FIG. 6I is a view showing an example for a method of forming TFT and liquid crystal display device showing in FIG. 4 and FIG. 2.

Liquid crystals were sealed by a usual method using the color filter portion 30 and the TFT portion by using a beads spacer to obtain a liquid crystal panel having a plastic substrate on the CF side and a glass substrate on the TFT side (FIG. 6F). Then, as shown in the second embodiment, an Xe—Cl light at a wavelength of 308 nm was irradiated from the side of the glass substrate to separate the glass substrate (FIG. 6G). A plastic substrate 10A was adhered as the polymer substrate (c) by a transparent adhesive 18 on the side where the glass substrate was attached (FIG. 6H) to bond the polarizers 11A and 11B to the upper and lower portion to complete a liquid crystal device. In this embodiment, while the TFT side was formed as an in-plane-switching transmissive type shown in FIG. 4, it may be formed also as a semi-transmissive type or reflective type, and, further, a vertical electric field type liquid crystal device shown in the second embodiment.

Fourth Example

Figure 14:
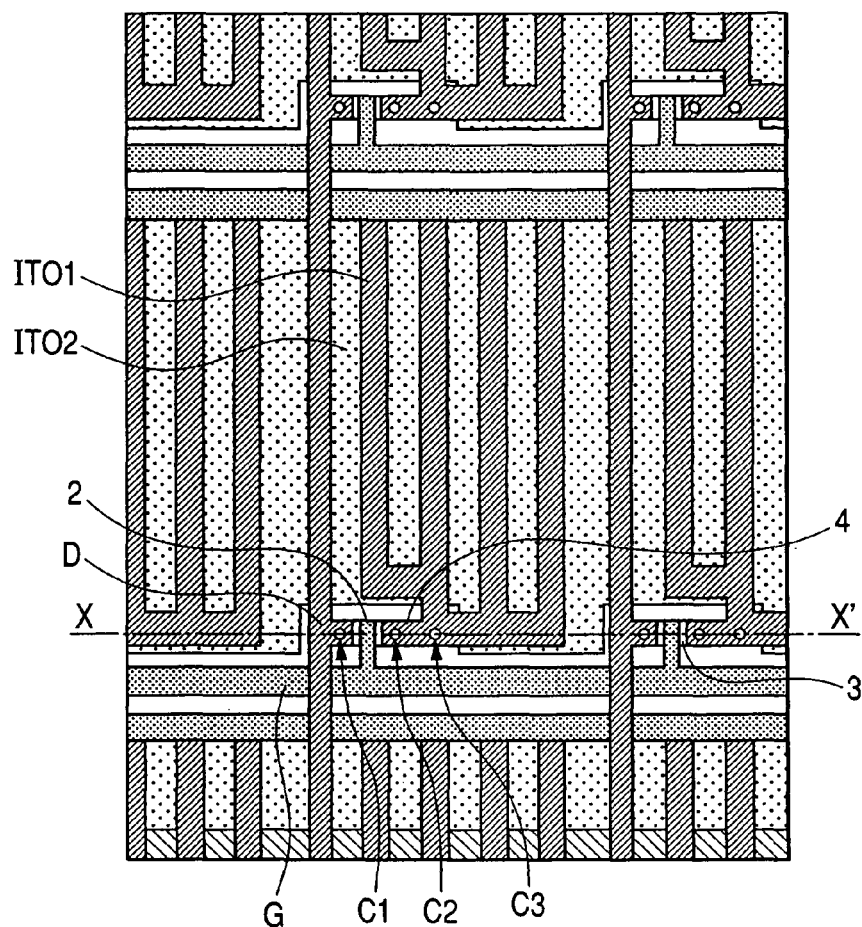
FIG. 14 is a plan view showing the constitution of a 1 sub-pixel for a modified example of a liquid crystal display panel according to an embodiment of the invention.
Figure 15:
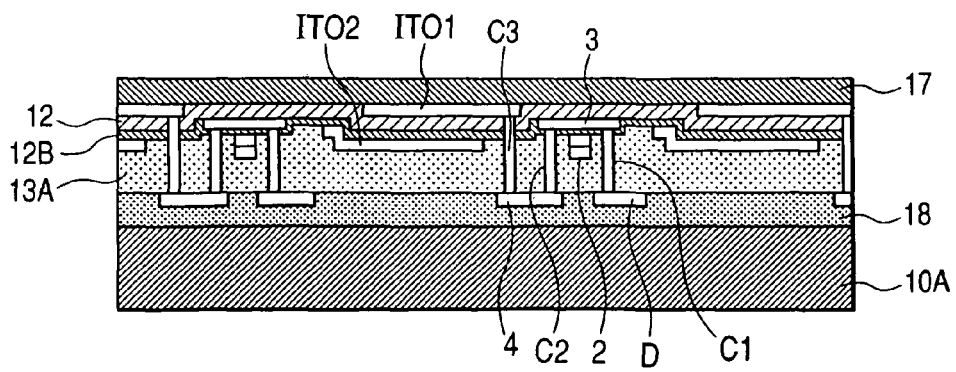
FIG. 15 is a cross sectional view showing a cross sectional structure along line X-X' shown in FIG. 14.

As other embodiment of the invention, FIG. 14 shows a plan view showing the constitution of 1-sub-pixel of a transmissive type in-plane-switching liquid crystal display panel and FIG. 15 shows a cross sectional view of a TFT along X-X' in FIG. 14. This embodiment has a feature of previously forming a heat resistant transparent polymer film on a support substrate, forming a TFT structure thereon in an upside-down structure and then inverting them. FIG. 16 shows the forming method as a cross sectional view. The forming method is to be described with reference to FIG. 16.

The heat resistant transparent polymer film 17 shown in the first embodiment was formed to 1 μm thickness on a glass substrate 19 as a support substrate (FIG. 16B), a pixel electrode ITO1 comprising ITO is formed thereon, and a first insulating layer 12 comprising $SiO_2$ or the like formed thereon. Then, a semiconductor layer 3, a gate insulation layer 12, a gate electrode 2, a common electrode ITO2, and an interlayer insulating layer 13A are formed on the first insulating layer. Then, contact holes C1, C2, C3 are formed, and a drain electrode D, and a source electrode 4 are formed successively to form TFT (FIG. 16C). Manufacture of the TFT active matrix element per se is conducted by the method according to a usual semiconductor process. Then, a plastic substrate 10A is adhered as a plastic substrate (c) by way of an adhesive layer 18 on the thus completed TFT active matrix substrate (FIG. 16D).

Then, as shown in the second embodiment, an Xe—Cl light at a wavelength of 308 nm is irradiated on the side of the glass substrate and the glass substrate is separated (FIG. 16E). The TFT of this embodiment is prepared in the upside-down structure from the first. Accordingly, it has a structure usable as it is for the liquid crystal device after separating the glass substrate.

Then, an alignment layer 15A is coated for the alignment of liquid crystal molecules to the surface from which the glass was separated and, after baking, a rubbing treatment is applied (FIG. 16F). In this embodiment, since the heat resistant transparent polymer film 17 is present on the ITO electrode ITO1, it can be rubbed as it is and used as the alighment layer. Also the method of this embodiment is not restricted to the liquid crystal display device, but is applicable also to a display device having an active device and a storage capacitance. Specifically, it is applicable also to an organic EL (OLED) display or an electrophoretic display.

Fifth Example

By using the material shown as (B-3) in the first embodiment, curing was conducted under nitrogen at 320° C. for 60 min to form a heat resistant transparent polymer film of 5.5 μm thickness to a quartz substrate as a support substrate. Then, a thin film transistor shown in FIG. 4 for the second embodiment was prepared in accordance with the preparing method in FIG. 5. In this embodiment, since quartz was used for the support substrate, UV-rays at a shorter wavelength less transmitting glass were allowed to transmit. By utilizing this, after adhesion of the protecting layer 21, a KrF excimer laser light at a wavelength of 248 nm (50 mJ/cm$^2$/pulse: 1 pulse for 20 nanosec) was irradiated from the quartz crystal surface. The heat resistant transparent polymer film used in the invention efficiently absorbed a light at a wavelength of 248 nm and, as a result, adhesion at the boundary of the quartz substrate/the heat resistant transparent polymer film was lowered and the substrate could be separated by two pulses, that is, at an irradiation dose of 100 mJ/cm$^2$. Subsequently, the semiconductor device was formed in the same method as for the second embodiment.

Sixth Example

Polyimide PIX-L110SX manufactured by HD Microsystems Co. Ltd. was coated as a polymer layer (b) on a glass substrate as a support substrate under nitrogen at 200° C. for 30 min and then at 400° C. for 60 min to obtain a cured film of 3.1 μm thickness. This material was a low heat expansion type polyimide with the coefficient of thermal expansion (CTE) as small as 10 ppm/K, but the obtained cured film has brown appearance.

A material (B-2) in the first embodiment was coated on the polymer layer (b) and cured under nitrogen at 310° C. for 60 min to form a heat resistant transparent polymer film of 7.5 μm thickness. A thin film transistor shown in FIG. 10 of the second embodiment was prepared in accordance with the preparation method shown in FIG. 5. After adhering the protecting layer 21 in the same manner as in the second embodiment, they were immersed in hot water at 50° C. and separation was attempted by utilizing the protecting layer. As a result, separation occurred at the boundary between the polymer layer (b) and the heat resistant transparent polymer film (B-2). Subsequently, a device was formed by the method of the second embodiment.

First Comparative Example

Polyimide PIX-3400 manufactured by HD Microsystems Ltd. was coated as a polymer film (a) on a glass substrate and cured under nitrogen at 200° C. for 30 min and then at 350° C. for 60 min to obtain a cured film of 4.0 μm thickness. The polyimide is an aromatic polyimide in which a portion of the structure is put to quinazolin ring modification. This material had a high heat resistance, high 3 wt % loss temperature of 495° C. and a glass transition temperature as high as of 290° C. Also for the result of thermal desorption spectroscopy, desorption of gas was not observed till the curing temperature of 350° C. and it was found that the heat resistance was high. However, this material had yellow appearance and although showed a transmittance of 85% or higher in a wavelength region of from 500 nm to 800 nm upon measurement of the transmittance, and it was found that the transmittance was lowered at a shorter wavelength, and the transmittance was 0% at a wavelength of 400 nm. Accordingly, it was found that the material was not suitable to the formation of a transmission device.

First Comparative Example-2

A polyamic acid solution obtained from pyromellitic dianhydride and 4,4-diaminodiphenyl ether was cured as a polymer film (a) under nitrogen at 200° C. for 30 min and then at 350° C. for 60 min to obtain a cured film of 8.0 μm thickness. This material had a high heat resistance, high 3 wt % loss temperature of 501° C., and a glass transition temperature as high as of 372° C. Also for the result of thermal desorption spectroscopy, desorption of gas was not observed till 360° C. and it was found that heat resistance was high. However, this material had yellow appearance and, although it showed a transmittance of 85% or higher in a wavelength region of from 500 nm to 800 nm upon measurement of the transmittance, it was found that the transmittance was lowered at a shorter wavelength, and the transmittance was 0% at a wavelength of 400 nm. Accordingly, it was found that the material was not suitable to the formation of a transmission device.

Second Comparative Example

Nano hybrid silicone FX-T350 manufactured by ADEKA Corp. was coated as a polymer film (a) on a glass substrate and cured under nitrogen at 300° C. for 30 min to obtain a cured film of 4.0 μm thickness. This material is a cross-linked material comprising a polysiloxane main skeleton. This material had a high transparency and the transmittance at 400 nm was 95%. The heat resistance was high and the 3 wt % less temperature was 450° C. Also for the result of conducting thermal desorption spectroscopy, gas desorption was not observed till the curing temperature of 300° C. and it was found that the heat resistance was high. However, the film was fragile and could not be separated after forming the device and it was found that the material was not suitable.

Third Comparative Example

A coating film was formed on a glass substrate using the material (B-3) shown in the first embodiment and cured under nitrogen at 300° C. for 60 min to obtain a cured film of 100 μm thickness. When the transmittance of the cured film was measured, it was 22% at 400 nm and 29% at 450 nm. Since the thickness was as large as 100 μm, transmittance to visible light was lowered and it was found that the material was not suitable.

Fourth Comparative Example

A coating film was formed on a glass substrate using the material (B-3) shown in the first embodiment and cured under nitrogen at 300° C. for 60 min to obtain a cured film of 0.5 μm thickness. When the transmittance of the cured film was measured, it showed transmittance as high as 93% at 400 nm and 94% at 450 nm. However, since the thickness was as thin as 0.5 μm, the strength as the film was poor and destruction tended to occur upon conducting the separation step to lower the yield and it was found that the material was not suitable.

Fifth Comparative Example

Films of the polymer materials shown in the following Table 2 were press bonded to glass substrates heated at 150° C. to 250° C.

TABLE 2

| Comparative example | Film material | Thickness (μm) | Transmittance (%) @400 nm | 3 wt % loss temperature (° C.) | Tg (° C.) | State under heating |
|---|---|---|---|---|---|---|
| 5-1 | Polycarbonate (PC) | 120 | 84 | 446 | 203 | Melted at 200° C., deformed |
| 5-2 | Polyethylene naphthalate (PEN) | 125 | 75 | 410 | 256 | Melted at 250° C., deformed |
| 5-3 | Polyethylene terephthalate (PET) | 125 | 88 | 350 | 110 | Melted at 120° C., deformed |
| 5-4 | Polyetger sylfone (PES) | 100 | 89 | 425 | 223 | Melted at 220° C., deformed |
| 5-5 | Cycloolefin copolymer | 100 | 91 | 421 | 172 | Melted at 150° C., deformed |

Any of the films in Table 2 had no problem in view of the transparency and the wt % loss temperature. However, it was found that melting upon heating occurred at 250° C. or lower and the film was deformed on the glass substrate, on which the semiconductor device could not be formed.

What is claimed is:

1. A method for manufacturing a semiconductor device including a step of forming a polymer film (a) above a support substrate, a step of forming a semiconductor element above the polymer film (a) that includes forming a gate electrode, forming a channel layer as a semiconductor layer, forming a gate insulating layer, and forming a source electrode and a drain electrode above the polymer film (a) that is formed above the support substrate, and a step of separating the support substrate from the polymer film (a) formed with the semiconductor element in which the polymer film (a) has a thickness of 1 μm or more and 30 μm or less, a transmittance of 80% of higher to a visible light at a wavelength of 400 nm or more and 800 nm or less, a 3 wt % loss temperature of 300° C. or higher and a melting point of 280° C. or higher, wherein the polymer film (a) includes at least one polymer material selected from a polyamidoimide having an alicyclic structure, a polyimide having an alicyclic structure, a polyamide having an alicyclic structure, poly(p-xylylene), and polybenzoxazole as represented by formula (1),

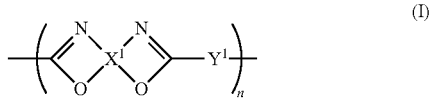  (I)

wherein n is an integer from 5 to 10,000, each $Y^1$ is independently selected from a bivalent aromatic group and a bivalent alicyclic group, and $X^1$ is represented by formula (2),

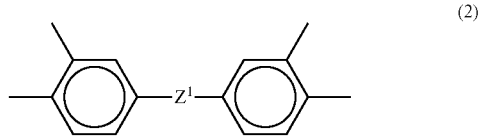  (2)

wherein each $Z^1$ is a direct bond or an organic group independently selected from a linear alkylene group of 1 to 6 carbon atoms, a branched alkylene group of 1 to 6 carbon atoms, $SO_2$, S, O, CO, NHCO, and $C(CB_3)_2$, and wherein B is a halogen selected from fluorine, chlorine, bromine and iodine.

2. A method for manufacturing a semiconductor device according to claim 1, further including a step of forming a polymer layer (b) between the support substrate and the polymer film (a).

3. A method for manufacturing a semiconductor device according to claim 2, wherein the coefficient of thermal expansion of the polymer layer (b) is smaller than the coefficient of thermal expansion of the polymer film (a).

4. A method for manufacturing a semiconductor device according to claim 3, wherein the polymer layer (b) includes a polyimide.

5. A method for manufacturing a semiconductor device according to claim 1, further including a step of forming an inorganic layer between the polymer film (a) and the semiconductor element.

6. A method for manufacturing a semiconductor device, according to claim 5, wherein the inorganic layer includes at least one member selected from silicon oxide, silicon oxynitride, silicon nitride, and aluminum oxide.

7. A method for manufacturing a semiconductor device according to claim 1, wherein the step of forming the polymer film (a) in a layer above the support substrate includes a heating treatment, the temperature of the heating treatment is 250° C. or higher and at or higher than the process temperature forming the semiconductor element.

8. A method for manufacturing a semiconductor device according to claim 7, wherein the heating treatment is a heating treatment under nitrogen or under vacuum.

9. A method for manufacturing a semiconductor device according to claim 1, wherein the support substrate is a glass substrate or a quartz substrate.

10. A method for manufacturing a semiconductor device according to claim 1, wherein the step of separating the support substrate from the polymer film (a) formed with the semiconductor element includes UV-ray irradiation with the wavelength of UV-rays being 300 nm or more and 400 nm or less.

11. A method for manufacturing a semiconductor device according to claim 1, further including a step of forming a protecting layer on the surface of the semiconductor element before the step of separating the support substrate from the polymer film (a) formed with the semiconductor element.

12. A method for manufacturing a semiconductor device according to claim 1, further including a step of bonding the polymer film (a) formed with the semiconductor element to a plastic substrate (c).

* * * * *